(12) United States Patent
Chen et al.

(10) Patent No.: US 10,665,572 B2
(45) Date of Patent: May 26, 2020

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Jie Chen, New Taipei (TW); Hsien-Wei Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/103,939

(22) Filed: Aug. 15, 2018

(65) Prior Publication Data

US 2020/0058622 A1 Feb. 20, 2020

(51) Int. Cl.
*H01L 25/07* (2006.01)
*H01L 23/00* (2006.01)
*H01L 23/31* (2006.01)
*H01L 23/538* (2006.01)
*H01L 25/00* (2006.01)

(52) U.S. Cl.
CPC ........ *H01L 25/072* (2013.01); *H01L 23/3114* (2013.01); *H01L 23/3121* (2013.01); *H01L 23/5384* (2013.01); *H01L 24/09* (2013.01); *H01L 24/17* (2013.01); *H01L 24/73* (2013.01); *H01L 25/50* (2013.01); *H01L 2224/0401* (2013.01)

(58) Field of Classification Search
CPC ... H01L 25/072; H01L 25/50; H01L 23/3114; H01L 23/3121; H01L 23/5384; H01L 24/09; H01L 24/17; H01L 24/73; H01L 2224/0401

USPC .......................................................... 257/678
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2018/0005984 A1* | 1/2018 | Yu .................... H01L 25/0652 |
| 2018/0151477 A1* | 5/2018 | Yu .................... H01L 21/561 |

* cited by examiner

*Primary Examiner* — Tu-Tu V Ho
(74) *Attorney, Agent, or Firm* — JCIPRNET

(57) ABSTRACT

A semiconductor package includes a first chip package including a plurality of first semiconductor dies and a first insulating encapsulant, a second semiconductor die, a third semiconductor die, and a second insulating encapsulant. The plurality of first semiconductor dies are electrically connected to each other, and the first insulating encapsulant encapsulates the plurality of first semiconductor dies. The second semiconductor die and the third semiconductor die are electrically communicated to each other by connecting to the first chip package, wherein the first chip package is stacked on the second semiconductor die and the third semiconductor die. The second insulating encapsulant encapsulates the first chip package, the second semiconductor die, and the third semiconductor die.

20 Claims, 15 Drawing Sheets

SEMICONDUCTOR PACKAGE AND MANUFACTURING METHOD THEREOF

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
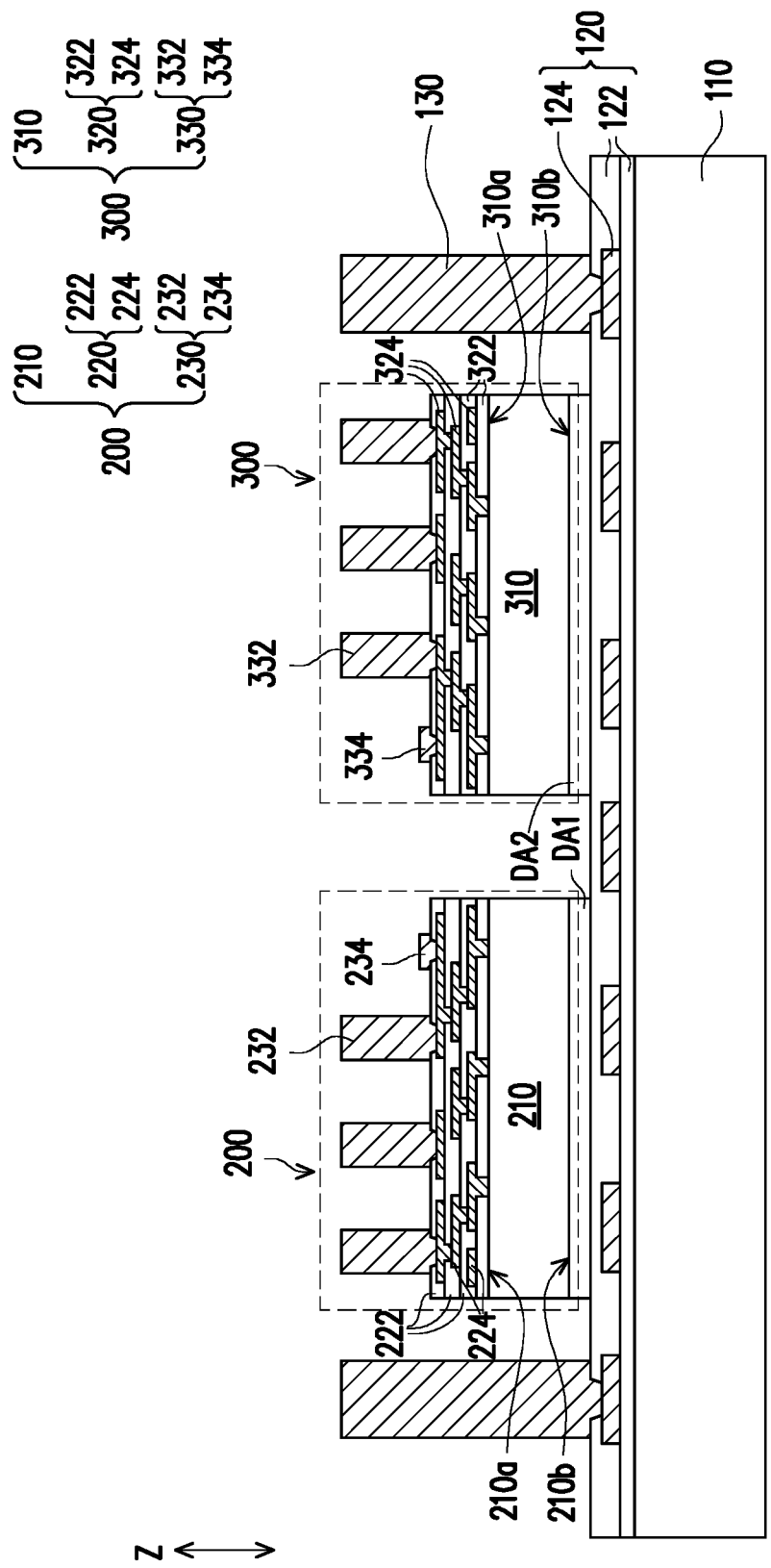
FIG. 1 to FIG. 6 are schematic cross sectional views of various stages in a manufacturing method of a semiconductor package in accordance with some embodiments of the disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 6 are schematic cross sectional views of various stages in a manufacturing method of a semiconductor package in accordance with some embodiments of the disclosure. FIG. 11 to FIG. 14 are schematic cross sectional views of various stages in a manufacturing method of a chip package included in a semiconductor package in accordance with some embodiments of the disclosure. In embodiments, the manufacturing method is part of a wafer level packaging process. In FIG. 1 to FIG. 6, two semiconductor dies are shown to represent plural semiconductor dies of the wafer, and a semiconductor package SP1 is shown to represent a semiconductor package obtained following the manufacturing method, for example. In other embodiments, more than two semiconductor chips or dies may be shown to represent plural semiconductor chips or dies of the wafer, and more than one semiconductor packages may be shown to represent plural semiconductor packages obtained following the manufacturing method, the disclosure is not limited thereto. In FIG. 11 to FIG. 14, two semiconductor dies are shown to represent plural dies included in one chip package CP1, for example. However, the disclosure is not limited thereto, and more than two semiconductor dies may be shown to represent plural dies included in one chip package CP1.

Referring to FIG. 1, in some embodiments, a carrier 110 is provided. In one embodiment, the carrier 110 may be a glass carrier or any suitable carrier for carrying a semiconductor wafer or a reconstituted wafer for the manufacturing method of the semiconductor package. In an alternative embodiment, the carrier 110 may be a reclaim wafer or a reconstituted wafer for the manufacturing method of the semiconductor package. For example, as the material of the carrier 110 is a Si substrate, the carrier 110 may serve as a heat dissipating element for the semiconductor package SP1. In such embodiments, the carrier 110 may further be used for warpage control.

In some alternative embodiments of which the carrier 110 is removed after the manufacture of the semiconductor package, the carrier 110 may further be coated with a debond layer (not shown). For example, the debond layer is disposed on the carrier 110, and the material of the debond layer may be any material suitable for bonding and debonding the carrier 110 from the above layer(s) (e.g., the buffer layer) or any wafer(s) disposed thereon. In some embodiments, the debond layer may include a release layer (such as a light-to-heat conversion ("LTHC") layer) or an adhesive layer (such as an ultra-violet curable adhesive or a heat curable adhesive layer).

Continued on FIG. 1, in some embodiments, a redistribution circuit structure 120 is formed on the carrier 110. For example, the formation of the redistribution circuit structure 120 includes sequentially forming one or more polymer dielectric layers 122 and one or more metallization layers 124 in alternation. In certain embodiments, the redistribution circuit structure 120 includes two polymer dielectric layers 122 and one metallization layer 124 sandwiched therebetween as shown in FIG. 1; however, the disclosure is not limited thereto. The numbers of the metallization layers and the polymer dielectric layers included in the redistribution circuit structure 120 are not limited thereto. For example, the numbers of the metallization layers and the polymer dielectric layers may be one or more than one. Due to the configuration of the polymer dielectric layers 122 and the metallization layer 124, a routing function is provided to the semiconductor package SP1. In other words, the redistribution circuit structure 120, for example, may be referred to as a back-side redistribution layer of a semiconductor die 200 and a semiconductor die 300.

In certain embodiments, as shown in FIG. 1, the metallization layer 124 is disposed over the carrier 110 and sandwiched between the polymer dielectric layers 122, where portions of a top surface of the metallization layer 124 are exposed by a topmost layer of the polymer dielectric layers 122 and a bottom surface of the metallization layer 124 is covered by a bottommost layer of the polymer dielectric layers 122. In some embodiments, the material of the polymer dielectric layers 122 may include polyimide, epoxy resin, acrylic resin, phenol resin, benzocyclobutene (BCB), polybenzoxazole (PBO), or any other suitable polymer-based dielectric material, and the polymer dielectric layer 122 may be formed by deposition. In some embodiments, the material of the metallization layer 124 may include aluminum, titanium, copper, nickel, tungsten, and/or alloys thereof, and the metallization layer 124 may be formed by electroplating or deposition. The disclosure is not limited thereto.

In some embodiments, as shown in FIG. 1, through vias 130 are formed on the redistribution circuit structure 120. For example, the through vias 130 are physically connected to the portions of the top surface of the metallization layer 124 exposed by the topmost layer of the polymer dielectric layers 122. In other words, the through vias 130 are electrically connected to the redistribution circuit structure 120. In some embodiments, the through vias 130 may be through integrated fan-out (InFO) vias. For simplification, only two through vias 130 are presented in FIG. 1 for illustrative purposes, however it should be noted that more than two through vias may be formed; the disclosure is not limited thereto. The number of the through vias 130 can be selected based on the demand.

In some embodiments, the through vias 130 are formed by photolithography, plating, photoresist stripping processes or any other suitable method. In one embodiment, the through vias 130 may be formed by forming a mask pattern (not shown) covering the redistribution circuit structure 120 with openings exposing the top surface of the metallization layer 124 exposed by the topmost layer of the polymer dielectric layers 122, forming a metallic material filling the openings to form the through vias 130 by electroplating or deposition and then removing the mask pattern. In one embodiment, the material of the through vias 130 may include a metal material such as copper or copper alloys, or the like. However, the disclosure is not limited thereto.

In some embodiments, at least one semiconductor die is provided. As shown in FIG. 1, in certain embodiments, the semiconductor die 200 and the semiconductor die 300 are provided and disposed on the redistribution circuit structure 120. For example, the semiconductor die 200 and the semiconductor die 300 are picked-up and placed on the redistribution circuit structure 120, and are attached or adhered on the redistribution circuit structure 120 through a connecting film DA1 and a connecting film DA2, respectively.

In some embodiments, the connecting films DA1, DA2 may be a die attach film, an adhesion paste or the like. In some embodiments, in a direction Z, the semiconductor die 200 and/or the semiconductor die 300 may have a thickness less than a height of the through vias 130, as shown in FIG. 1. However, the disclosure is not limited thereto. In an alternative embodiment, in the direction Z, the thickness of the semiconductor die 200 and/or the semiconductor die 300 may be greater than or substantially equal to the height of the through vias 130. As shown in FIG. 1, the semiconductor die 200 and the semiconductor die 300 may be picked-up and placed on the redistribution circuit structure 120 after the formation of the through vias 130. However, the disclosure is not limited thereto. In an alternative embodiment, the semiconductor die 200 and the semiconductor die 300 may be picked-up and placed on the redistribution circuit structure 120 before the formation of the through vias 130. The cross-sectional shape of the through vias 130 may be selected based on demand, and are not limited to the embodiments of the disclosure.

For example, as shown in FIG. 1, the semiconductor die 200 includes a semiconductor substrate 210 having an active surface 210a, an interconnection structure 220 formed on the active surface 210a, and connecting vias 230 electrically connecting to the interconnection structure 220.

In some embodiments, the semiconductor substrate 210 may be a silicon substrate including active components (e.g., transistors or the like) and/or passive components (e.g., resistors, capacitors, inductors or the like) formed therein. The disclosure is not limited thereto.

In some embodiments, the interconnection structure 220 includes one or more inter-dielectric layers 222 and one or more patterned conductive layers 224 stacked alternately. In certain embodiments, the patterned conductive layers 224 are sandwiched between the inter-dielectric layers 222, where portions of a top surface of a topmost layer of the patterned conductive layers 224 are exposed by a topmost layer of the inter-dielectric layers 222 and physically connected to the connecting vias 230, and portions of a bottommost layer of the patterned conductive layers 224 are exposed by a bottommost layer of the inter-dielectric layers 222 and electrically connected to the active components and/or passive components (not shown) formed in the semiconductor substrate 210. As shown in FIG. 1, the bottommost layer of the inter-dielectric layers 222 is located on the active surface 210a of the semiconductor substrate 210, and the topmost layer of the inter-dielectric layers 222 is at least partially in contact with the connecting vias 230. The numbers of the inter-dielectric layers 222 and the patterned conductive layers 224 may be selected based on demand, and are not limited in the disclosure.

In one embodiment, the inter-dielectric layers 222 may be polyimide, PBO, BCB, a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the inter-dielectric layers 222 may be formed by suitable fabrication techniques such as spin-on coating, chemical vapor deposition (CVD), plasma-enhanced chemical vapor deposition (PECVD) or the like. In one embodiment, the patterned conductive layers 224 may be made of conductive materials formed by electroplating or deposition, such as copper, copper alloy, aluminum, aluminum alloy, or combinations thereof, which may be patterned using a photolithography and etching process. In some embodiments, the patterned conductive layers 224 may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In some embodiments, the connecting vias 230 includes one or more the connecting vias 232 and one or more the connecting vias 234, where a height of the connecting vias 232 is greater than a height of the connecting via 234 as measured in the direction Z. As shown in FIG. 1, although only three connecting vias 232 and one connecting via 234 are presented in FIG. 1 for illustrative purposes, it should be noted that the numbers of the connecting via 232 and the connecting via 234 may be selected or designated based on the demand and the design layout; the disclosure is not limited thereto. In certain embodiments, the connecting vias 230 includes a plurality of the connecting vias 232, where no connecting via 234 is included (see a semiconductor die 200a depicted in FIG. 7 to FIG. 9). In one embodiment, the connecting vias 232 and the connecting via 234 may be formed in different steps, where the connecting vias 232 may be formed prior to the formation of the connecting via 234, or vice versa. As shown in FIG. 1, the connecting vias 232 and the connecting via 234 are electrically connected to the interconnection structure 220.

For example, as shown in FIG. 1, the semiconductor die 300 includes a semiconductor substrate 310 having an active surface 310a, an interconnection structure 320 formed on the active surface 310a, and connecting vias 330 electrically connecting to the interconnection structure 320.

In some embodiments, the semiconductor substrate 310 may be a silicon substrate including active components (e.g., transistors or the like) and/or passive components (e.g., resistors, capacitors, inductors or the like) formed therein. The disclosure is not limited thereto.

In some embodiments, the interconnection structure 320 includes one or more inter-dielectric layers 322 and one or more patterned conductive layers 324 stacked alternately. In certain embodiments, the patterned conductive layers 324 are sandwiched between the inter-dielectric layers 322, where portions of a top surface of a topmost layer of the patterned conductive layers 324 are exposed by a topmost layer of the inter-dielectric layers 322 and physically connected to the connecting vias 330, and portions of a bottommost layer of the patterned conductive layers 324 are exposed by a bottommost layer of the inter-dielectric layers 322 and electrically connected to the active components and/or passive components (not shown) formed in the semiconductor substrate 310. As shown in FIG. 1, the bottommost layer of the inter-dielectric layers 322 is located on the active surface 310a of the semiconductor substrate 310, and the topmost layer of the inter-dielectric layers 322 is at least partially in contact with the connecting vias 330. The numbers of the inter-dielectric layers 322 and the patterned conductive layers 324 may be selected based on demand, and are not limited in the disclosure.

In one embodiment, the inter-dielectric layers 322 may be polyimide, PBO, BCB, a nitride such as silicon nitride, an oxide such as silicon oxide, PSG, BSG, BPSG, a combination thereof or the like, which may be patterned using a photolithography and/or etching process. In some embodiments, the inter-dielectric layers 322 may be formed by suitable fabrication techniques such as spin-on coating, CVD, PECVD or the like. In one embodiment, the patterned conductive layers 324 may be made of conductive materials formed by electroplating or deposition, such as copper, copper alloy, aluminum, aluminum alloy, or combinations thereof, which may be patterned using a photolithography and etching process. In some embodiments, the patterned conductive layers 324 may be patterned copper layers or other suitable patterned metal layers.

In some embodiments, the connecting vias 330 includes one or more the connecting vias 332 and one or more the connecting vias 334, where a height of the connecting vias 332 is greater than a height of the connecting via 334 as measured in the direction Z. As shown in FIG. 1, although only three connecting vias 332 and one connecting via 334 are presented in FIG. 1 for illustrative purposes, it should be noted that the numbers of the connecting via 332 and the connecting via 334 may be selected or designated based on the demand and the design layout; the disclosure is not limited thereto. In certain embodiments, the connecting vias 330 includes a plurality of the connecting vias 332, where no connecting via 334 is included (see a semiconductor die 300a depicted in FIG. 7 to FIG. 9). In one embodiment, the connecting vias 332 and the connecting via 334 may be formed in different steps, where the connecting vias 332 may be formed prior to the formation of the connecting via 334, or vice versa. As shown in FIG. 1, the connecting vias 332 and the connecting via 334 are electrically connected to the interconnection structure 320.

In one embodiment, the semiconductor die 200 and the semiconductor die 300 are the same. In an alternative embodiment, the semiconductor die 200 is different from the semiconductor die 300. The disclosure is not limited thereto.

Figure 2:
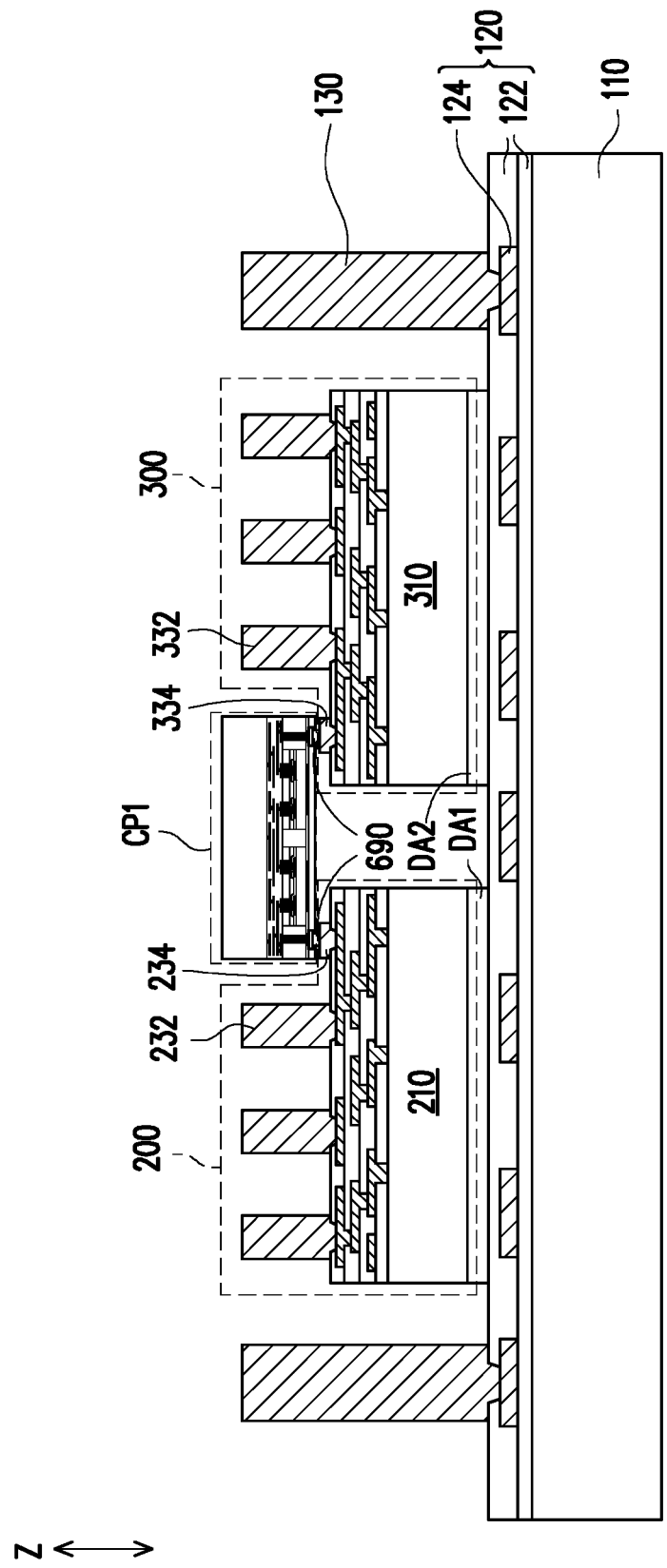
Figure 11:
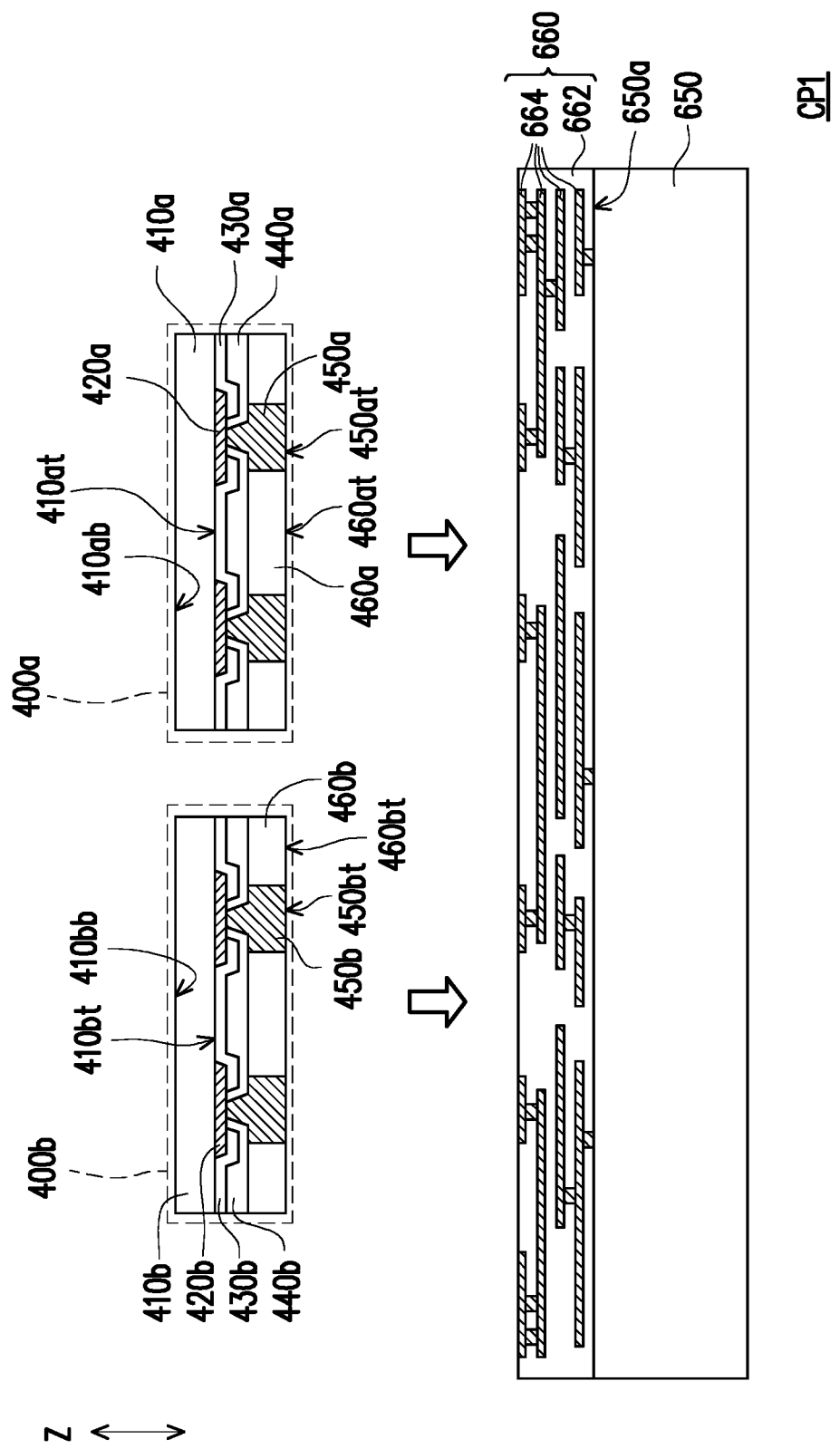
FIG. 11 to FIG. 14 are schematic cross sectional views of various stages in a manufacturing method of a chip package included in a semiconductor package in accordance with some embodiments of the disclosure.

Referring to FIG. 2, in some embodiments, a chip package CP1 is provided and disposed on the carrier 110. For example, the formation of the chip package CP1 of FIG. 2 may be described in FIG. 11 to FIG. 14, however the disclosure is not limited thereto. Referring to FIG. 11, in some embodiments, a semiconductor substrate 650 with an interconnection structure 660 disposed thereon is provided. In one embodiment, the material of the semiconductor substrate 650 may include a silicon substrate including active components (e.g., transistors and/or memories such as NMOS and/or PMOS devices, or the like) and/or passive components (e.g., resistors, capacitors, inductors or the like) formed therein. In an alternative embodiment, the semiconductor substrate 650 may be a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. The disclosure is not limited thereto.

In one embodiment, the interconnection structure 660 is formed on an active surface 650a of the semiconductor substrate 650. In certain embodiments, the interconnection structure 660 may include one or more inter-dielectric layers 662 and one or more patterned conductive layers 664 stacked alternately. For example, the inter-dielectric layers 662 may be silicon oxide layers, silicon nitride layers, silicon oxy-nitride layers, or dielectric layers formed by other suitable dielectric materials, and may be formed by deposition or the like. For example, the patterned conductive layers 664 may be patterned copper layers or other suitable patterned metal layers, and may be formed by electroplating or deposition. However, the disclosure is not limited thereto. In some embodiments, the patterned conductive layers 664 may be formed by dual-damascene method. As shown in FIG. 11, a top surface of a topmost layer of the patterned conductive layers 664 is accessibly revealed by a topmost layer of the inter-dielectric layers 662, for example. In addition, there is a high degree of coplanarity between the top surfaces of the topmost layer of the patterned conductive layers 664 and the topmost layer of the inter-dielectric layers 662. The numbers of the layers of the inter-dielectric layers 662 and the patterned conductive layers 664 may be less than or more than what is depicted in FIG. 11, and may be designated based on the demand and/or design layout; the disclosure is not specifically limited thereto.

Continued on FIG. 11, in some embodiments, a semiconductor die 400a and a semiconductor die 400b are picked and placed on the interconnection structure 660. In some embodiments, the semiconductor die 400a includes a semiconductor substrate 410a having an active surface 410at and a backside surface 410ab opposite to the active surface 410at, a plurality of conductive pads 420a formed on the active surface 410at, a passivation layer 430a disposed on and partially exposing the conductive pads 420a, a post-passivation layer 440a disposed on the passivation layer 430a and partially exposing the conductive pads 420a, connecting vias 450a disposed on the conductive pads 420a, and a protection layer 460a covering the post-passivation layer 440a and wrapping sidewalls of the connecting vias 450a. In other words, the conductive pads 420a distributed on the active surface 410at of the semiconductor substrate 410a are partially exposed by contact openings of the passivation layer 430a and contact openings of the post-passivation layer 440a, so as to connect to the connecting vias 450a.

In some embodiments, the material of the semiconductor substrate 410a may include a silicon substrate including active components (e.g., transistors and/or memories such as NMOS and/or PMOS devices, or the like) and/or passive components (e.g., resistors, capacitors, inductors or the like) formed therein. In an alternative embodiment, the semiconductor substrate 410a may be a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. The disclosure is not limited thereto.

In some embodiments, the conductive pads 420a may be aluminum pads or other suitable metal pads. The connecting vias 450a may be copper pillars, copper alloy pillar or other suitable metal pillars, for example. In some embodiments, the passivation layer 430a, the post-passivation layer 440a and/or the protection layer 460a may be a PBO layer, a polyimide (PI) layer or other suitable polymers. In certain embodiments, the passivation layer 430a, the post-passivation layer 440a and/or the protection layer 460a may be made of inorganic materials, such as silicon oxide, silicon nitride, silicon oxynitride, or any suitable dielectric material. In one embodiment, the materials of the passivation layer 430a, the post-passivation layer 440a and/or the protection layer 460a may be the same. In an alternative embodiment, the materials of the passivation layer 430a, the post-passivation layer 440a and/or the protection layer 460a may be different from one another, the disclosure is not limited thereto.

In some embodiments, the semiconductor die 400b includes a semiconductor substrate 410b having an active surface 410bt and a backside surface 410bb opposite to the active surface 410bt, a plurality of conductive pads 420b formed on the active surface 410bt, a passivation layer 430b disposed on and partially exposing the conductive pads 420b, a post-passivation layer 440b disposed on the passivation layer 430b and partially exposing the conductive pads 420b, connecting vias 450b disposed on the conductive pads 420b, and a protection layer 460b covering the post-passivation layer 440b and wrapping sidewalls of the connecting vias 450b. In other words, the conductive pads 420b distributed on the active surface 410bt of the semiconductor substrate 410b are partially exposed by contact openings of the passivation layer 430b and the post-passivation layer 440b, so as to connect to the connecting vias 450b. For example, the materials of the semiconductor substrate 410b, the conductive pads 420b, the passivation layer 430b, the post-passivation layer 440b, the connecting vias 450b and the protection layer 460b may be the same or similar to the materials of the semiconductor substrate 410a, the conductive pads 420a, the passivation layer 430a, the post-passivation layer 440a, the connecting vias 450a and the protection layer 460a, thus may not be repeated herein.

Figure 12:
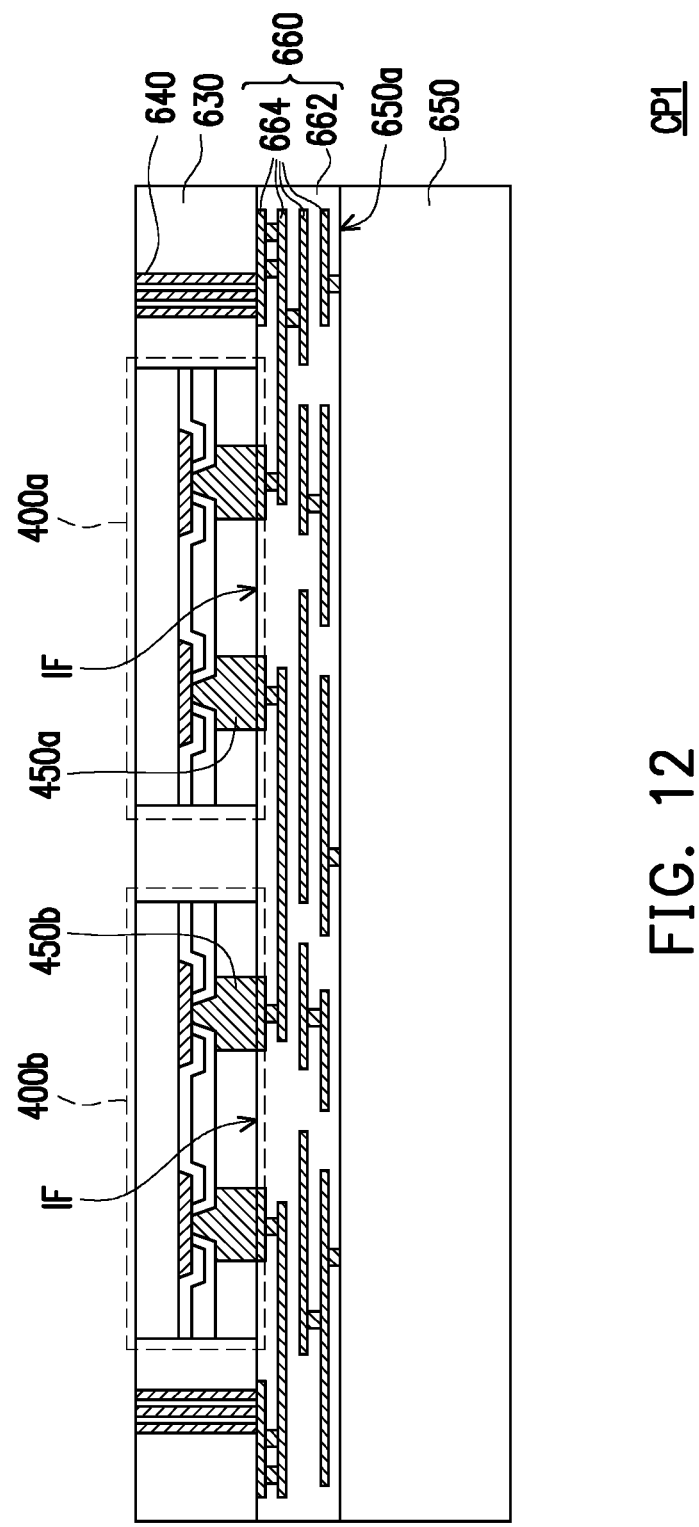

Referring to FIG. 11 and FIG. 12 together, in some embodiments, the semiconductor die 400a and the semiconductor die 400b are bonded to the interconnection structure 660 disposed on the semiconductor substrate 650 by hybrid bonding (through a hybrid bonding interface IF). As shown in FIG. 12, for example, a portion of the interconnection structure 660 is not covered by the semiconductor die 400a and the semiconductor die 400b. For example, the hybrid bonding process may include hydrophilic fusion bonding process or hydrophobic fusion bonding process. In one embodiment, a hydrophilic fusion bonding process is performed, where a workable bonding temperature approximately ranges from 100° C. to 300° C. and a workable bonding pressure is approximately greater than 1-5 MPa; however, the disclosure is not specifically limited thereto. Referring to FIG. 12, in some embodiments, an insulating encapsulant 630 is formed over the semiconductor substrate 650, where the semiconductor die 400a and the semiconductor die 400b are encapsulated in the insulating encapsulant 630, and the interconnection structure 660 exposed by the semiconductor dies 400a, 400b are covered by the insulating encapsulant 630. In some embodiments, as shown in FIG. 12, sidewalls of the semiconductor die 400a and the semiconductor die 400b are surrounded and covered by the insulating encapsulant 630. In some embodiments, the insulating encapsulant 630 may be an oxide (such as silicon oxide or the like). In some embodiments, the insulating encapsulant 630 may be formed by deposition.

Continued on FIG. 12, in some embodiments, a plurality of through vias 640 are formed in the insulating encapsulant 630. In one embodiment, the material of the through vias 640 may include a metal material such as copper or copper alloys, or the like. However, the disclosure is not limited thereto. In some embodiments, the formation of the through vias 640 may include patterning the insulating encapsulant 630 to form through openings exposing the patterned conductive layers 664 and filling conductive material into the through openings to form the through vias 640 penetrating the insulating encapsulant 630 and electrically connected to the interconnection structure 660. The patterning process, for example, may include laser drilling process, or photolithography and etching process(es). The number and size of the through vias 640 is not limited to FIG. 12, and may be selected based on the demand.

For example, the interconnection structure 660 is located between the semiconductor substrate 650 and the semiconductor dies 400a and 400b, between the semiconductor substrate 650 and the insulating encapsulant 630, and between the semiconductor substrate 650 and the through vias 640, where the exposed topmost layer of the patterned conductive layers 664 respectively prop against the connecting vias 450a, the connecting vias 450b, and the through vias 640. Through the topmost layer of the patterned conductive layers 664, the connecting vias 450a, and the connecting vias 450b, the semiconductor substrate 650 is bonded to the semiconductor die 400a and the semiconductor die 400b, and the interconnection structure 660 is electrically connected to the semiconductor die 400a, the semiconductor die 400b, and the through vias 640.

In one embodiment, the insulating encapsulant 630 may over-mold the semiconductor dies 400a, 400b and may need to be planarized to exposing the backside surface 410ab of the semiconductor die 400a and the backside surface 410bb of the connecting vias 450b of the semiconductor die 400b prior to the formation of the through vias 640. In a further embodiment, a planarizing step may be performed to the insulating encapsulant 630, the semiconductor dies 400a, 400b and the through vias 640 so that the surfaces of the insulating encapsulant 630, the semiconductor dies 400a, 400b and the through vias 640 are coplanar to one another; thereby obtaining a high coplanarity among the insulating encapsulant 630, the semiconductor dies 400a, 400b and the through vias 640. In some embodiments, the planarizing step may be a grinding process or a chemical mechanical polishing (CMP) process. After the planarizing step, a cleaning step may be optionally performed, for example to clean and remove the residue generated from the planarizing step. However, the disclosure is not limited thereto, and the planarizing step may be performed through any other suitable method. The disclosure is not limited thereto.

Figure 13:
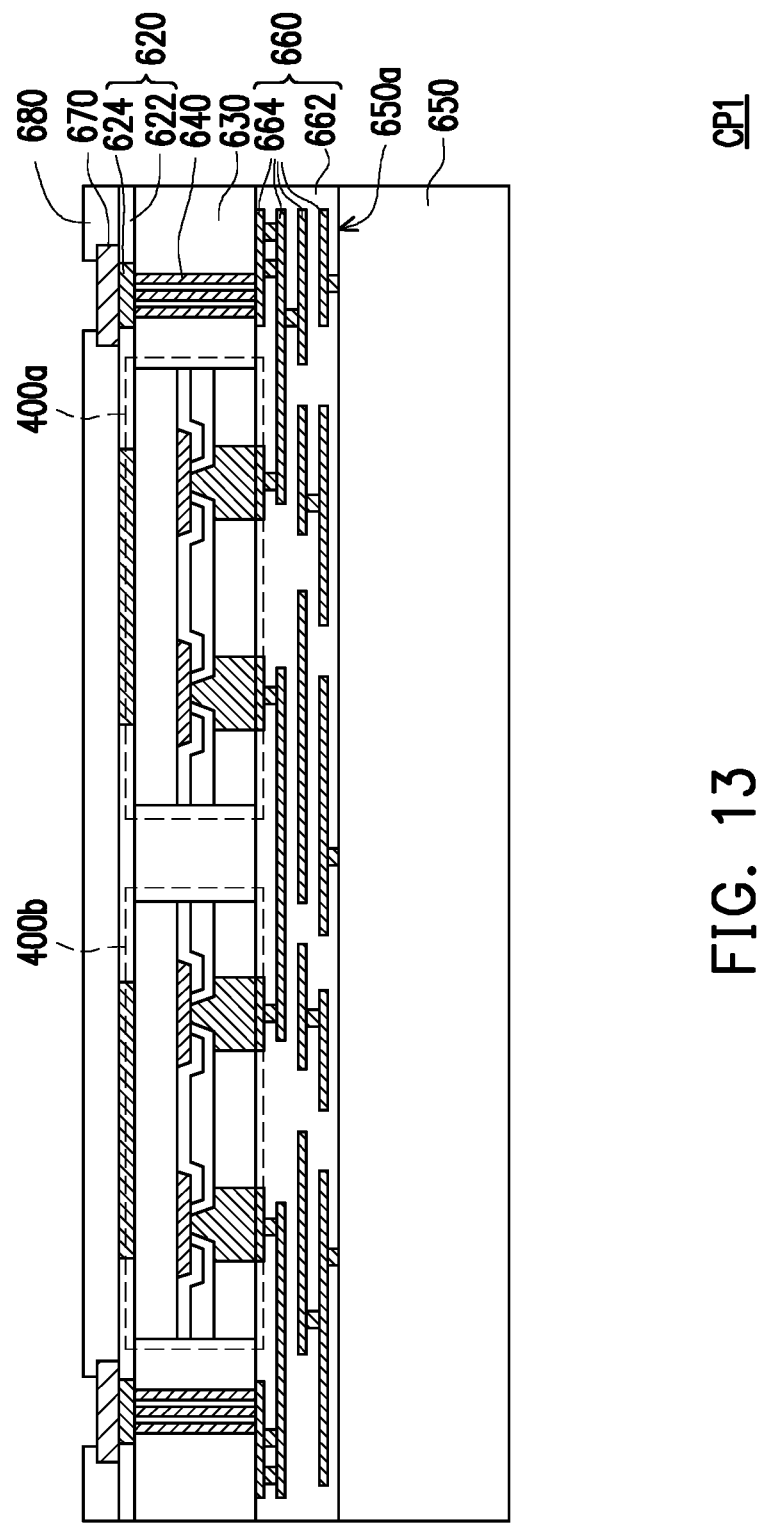

Referring to FIG. 13, in some embodiments, a redistribution circuit structure 620 includes one polymer dielectric layer 622 and one metallization layer 624 is formed on the insulating encapsulant 630; however, the disclosure is not limited thereto. The numbers of the metallization layers 624 and the polymer dielectric layers 622 included in the redistribution circuit structure 620 are not limited thereto. For example, the numbers of the metallization layers 624 and the polymer dielectric layers 622 may be one or more than one. For example, the material and formation of the polymer dielectric layer 622 may be the same or similar to the material and formation of the polymer dielectric layers 122 described in FIG. 1, and the material and formation of the metallization layer 624 may be the same or similar to the material and formation of the metallization layer 124 described in FIG. 1, thus may not be repeated herein.

Continued on FIG. 13, in some embodiments, contact pads 670 are formed on the exposed portions of the metallization layer 624 of the redistribution circuit structure 620. The contact pads 670 are connected to the exposed portions of the metallization layer 624 of the redistribution circuit structure 620; and thus, through the redistribution circuit structure 620, the through vias 640 and the interconnection structure 660, the contact pads 670 are electrically connected to the semiconductor die 400a and the semiconductor die 400b. The material of the contact pads 670, for example, may include aluminum or aluminum alloy. In some embodiments, a protection layer 680 is formed over the redistribution circuit structure 620 and on the contact pads 670, where the protection layer 680 includes a plurality of openings exposing the contact pads 670.

Figure 14:
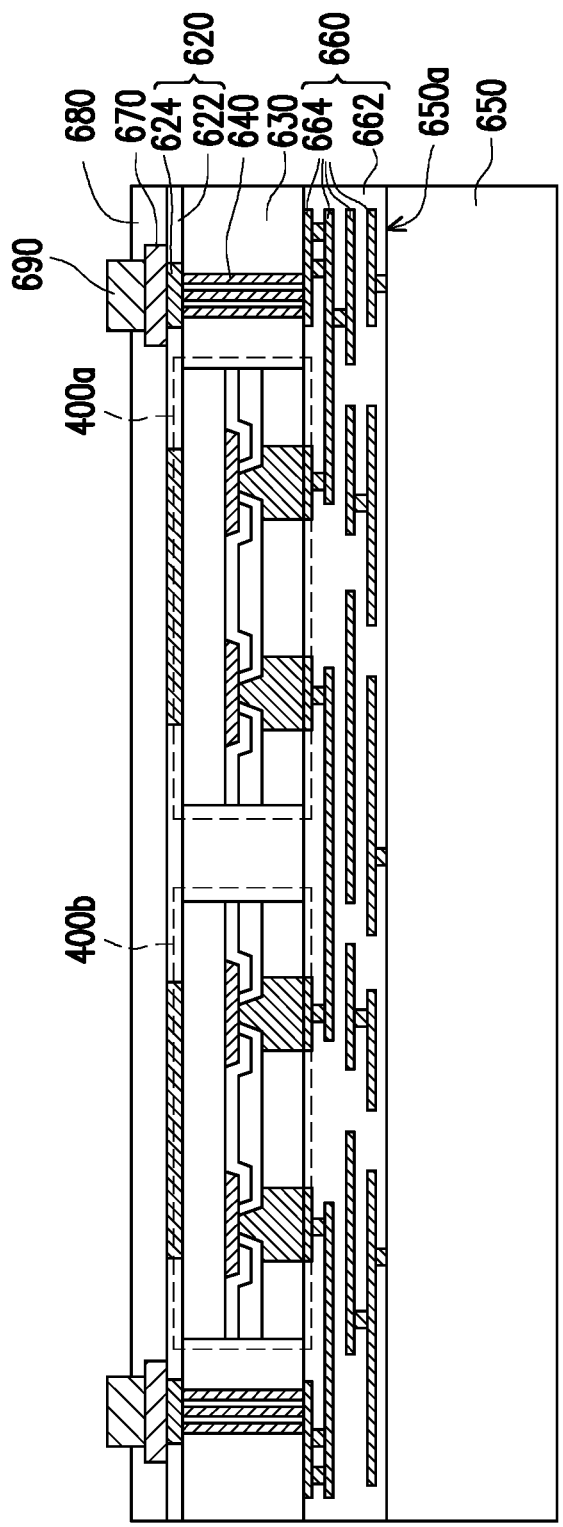

Referring to FIG. 14, in some embodiments, connecting vias 690 are formed on the protection layer 680 and physically connected to the contact pads 670. In other words, through the contact pad 670, the redistribution circuit structure 620, the through vias 640 and the interconnection structure 660, the connecting vias 690 are electrically connected to the semiconductor die 400a and the semiconductor die 400b. In some embodiments, a dicing (or singulation) process is sequentially performed to cut the wafer having a plurality of the chip package CP1 connected therebetween into individual and separated chip package CP1. In one embodiment, the dicing process is a wafer dicing process including mechanical blade sawing or laser cutting. The disclosure is not limited thereto. Up to here, the manufacture of the chip package CP1 is completed. In some embodiments, during the dicing process, a holding device (not shown) is adopted to secure the chip package CP1 before dicing to prevent damages caused by the dicing (or singulation) process. For example, the holding device may be an adhesive tape, a carrier film or a suction pad.

Referring back to FIG. 2, in some embodiments, the chip package CP1 is bonded to the semiconductor die 200 and the semiconductor die 300 by flip chip bonding. For example, the chip package CP1 is physically connected to the semiconductor die 200 and the semiconductor die 300, where the connecting vias 690 of the chip package CP1 are physically connected to the connecting via 234 of the semiconductor die 200 and the connecting via 334 of the semiconductor die 300, respectively. In some embodiments, as shown in FIG. 2, the chip package CP1 is overlapped with the semiconductor die 200 and the semiconductor die 300 in a stacking direction (e.g. the direction Z) of the redistribution circuit structure 120 and the semiconductor die 200 (or saying, the stacking direction of the redistribution circuit structure 120 and the semiconductor die 300), and extends from the semiconductor die 200 to the semiconductor die 300 in a vertical projection on the redistribution circuit structure 120. Note that, the semiconductor die 200 and the semiconductor die 300 are not overlapped with each other along the stacking direction (e.g. the direction Z), and are laterally arranged next to each other. Through the chip package CP1, the semiconductor die 200 and the semiconductor die 300 are electrically connected to each other. Due to the configuration, a short electrical path among the semiconductor die 200a, the semiconductor die 300a and the chip package CP1 (involving other semiconductor dies 400a, 400b) is achieved, thereby reducing signal loss thereof.

Figure 3:
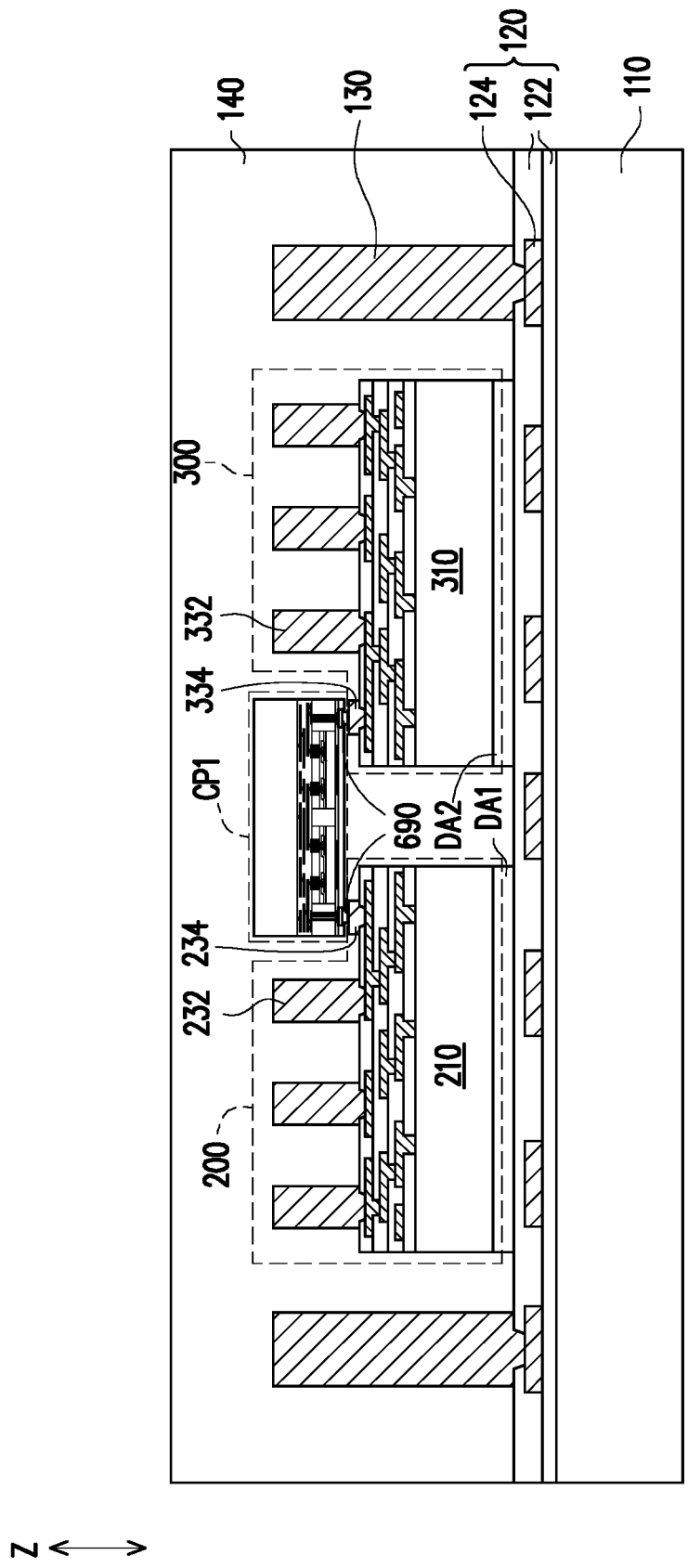

Referring to FIG. 3, in some embodiments, an insulating encapsulant 140 is formed over the carrier 110 (e.g., on the redistribution circuit structure 120) to encapsulate the semiconductor die 200, the semiconductor die 300, the chip package CP1, and the through vias 130. In other words, the semiconductor die 200, the semiconductor die 300, the chip package CP1, and the through vias 130 are covered by and embedded in the insulating encapsulant 140. In some embodiments, the insulating encapsulant 140 is a molding compound formed by a molding process, and the material of the insulating encapsulant 140 may include epoxy or other suitable resins. For example, the insulating encapsulant 140 may be epoxy resin containing chemical filler.

Figure 4:
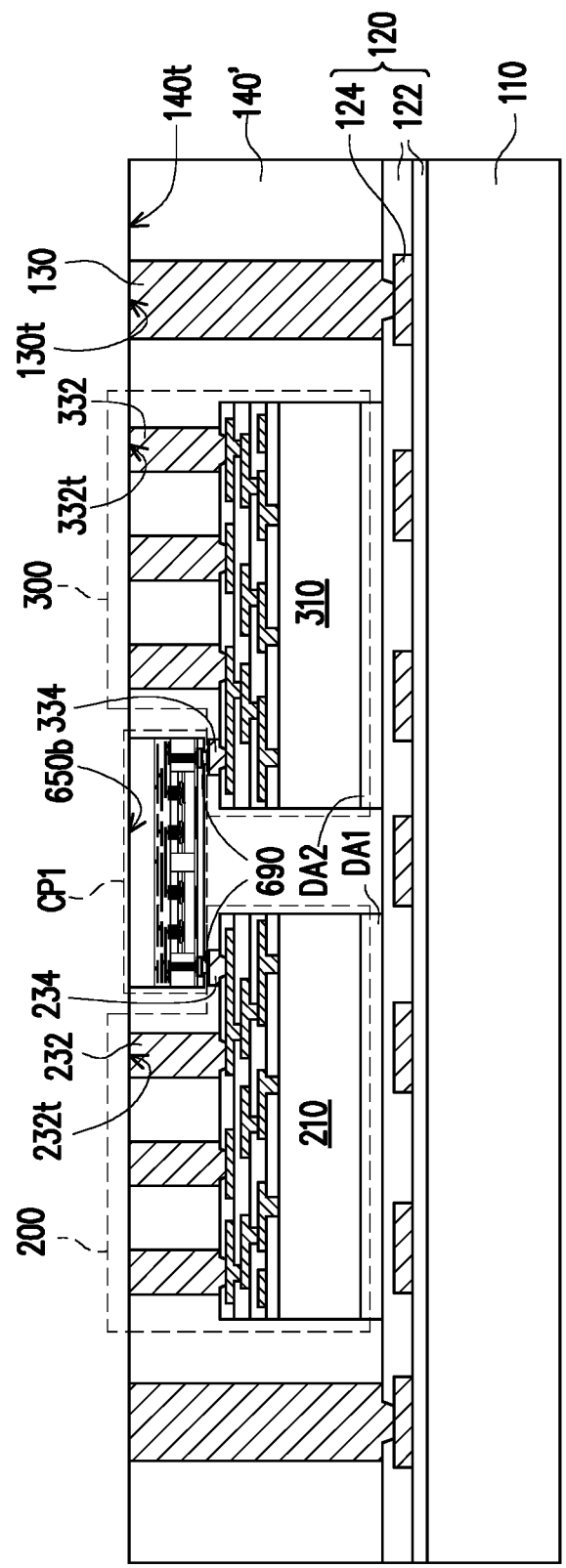

Referring to FIG. 3 and FIG. 4, in some embodiments, the insulating encapsulant 140 and the chip package CP1 are planarized until a surface of the chip package CP1 (e.g. a bottom surface 650b of the semiconductor substrate 650), top surfaces 232t of the connecting vias 232, a top surface 234t of the connecting via 234, top surfaces 332t of the connecting vias 332, a top surface 334t of the connecting via 334 and top surfaces 130t of the through vias 130 are exposed. After the insulating encapsulant 140 is planarized, an insulating encapsulant 140' is formed over the carrier 110 (e.g., on the redistribution circuit structure 120). During the planarized process of the insulating encapsulant 140 (shown in FIG. 4), the connecting vias 232 and the connecting via 234 of the semiconductor die 200 and/or the connecting vias 332 and the connecting via 334 of the semiconductor die 300 may also be planarized. In some embodiments, as shown in FIG. 4, during the planarized process of the insulating encapsulant 140 and the chip package CP1, portions of the through vias 130 may be planarized also. The insulating encapsulant 140' may be formed by mechanical grinding or CMP, for example. After the planarizing process, a cleaning step may be optionally performed, for example to clean and remove the residue generated from the planarizing step. However, the disclosure is not limited thereto, and the planarizing step may be performed through any other suitable method.

Figure 5:
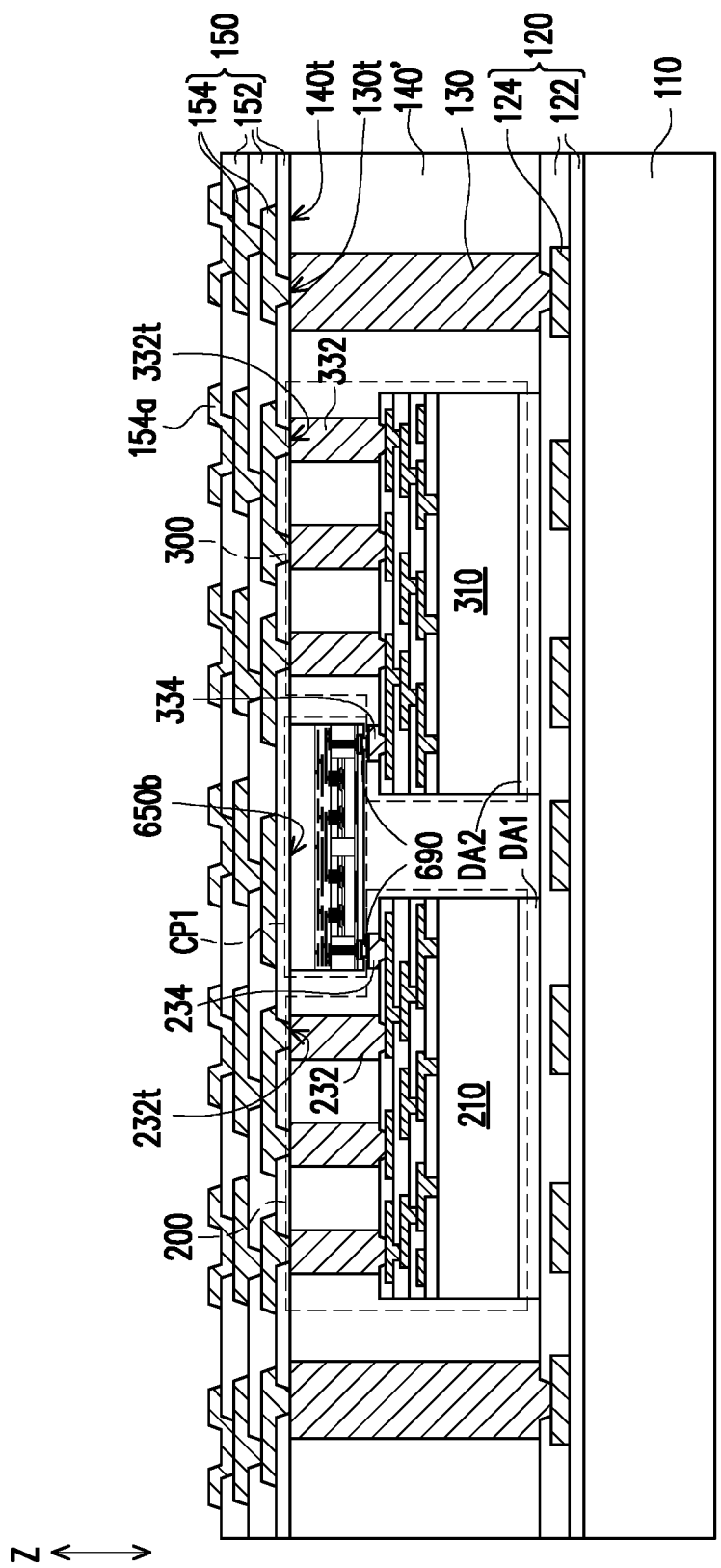

Referring to FIG. 5, in some embodiments, after the insulating encapsulant 140' is formed, a redistribution circuit structure 150 is formed on the planarized insulating encapsulant 140'. In some embodiments, the redistribution circuit structure 150 is formed on the top surface 140t of the insulating encapsulant 140', the bottom surface 650b of the semiconductor substrate 650, the top surfaces 232t of the connecting vias 232, the top surfaces 332t of the connecting vias 332 and the top surfaces 130t of the through vias 130. That is, the redistribution circuit structure 150 is formed on the insulating encapsulant 140' along the stacking direction (e.g. the direction Z) of the redistribution circuit structure 120 and the semiconductor die 200 (or saying, the stacking direction of the redistribution circuit structure 120 and the semiconductor die 300). In certain embodiments, the redistribution circuit structure 150 is fabricated to electrically connect with one or more connectors underneath. Here, the afore-said connectors may be the connecting vias 232 of the semiconductor die 200, the connecting vias 332 of the semiconductor die 300 and the through vias 130 embedded in the insulating encapsulant 140'. In other words, the redistribution circuit structure 150 is electrically connected to the connecting vias 232 of the semiconductor die 200, the connecting vias 332 of the semiconductor die 300, and the through vias 130.

Continued on FIG. 5, in some embodiments, the redistribution circuit structure 150 includes a plurality of polymer dielectric layers 152 and a plurality of metallization layers 154 stacked alternately, and the metallization layers 154 are electrically connected to the connecting vias 232 of the semiconductor die 200, the connecting vias 332 of the semiconductor die 300 and the through vias 130 embedded in the insulating encapsulant 140'. As shown in FIG. 5, in some embodiments, the top surfaces 232t of the connecting vias 232, the top surfaces 332t of the connecting vias 332 and the top surfaces 130t of the through vias 130 are in contact with the redistribution circuit structure 150. In such embodiments, the top surfaces 232t of the connecting vias 232, the top surfaces 332t of the connecting vias 332 and the top surfaces 130t of the through vias 130 are in contact with a bottommost layer of the metallization layers 154. In some embodiments, the top surfaces 232t of the connecting vias 232, the top surfaces 332t of the connecting vias 332 and the top surfaces 130t of the through vias 130 are partially covered by a bottommost layer of the polymer dielectric layers 152.

In certain embodiments, a topmost layer of the metallization layers 154 may include a plurality of pads. In such embodiments, the above-mentioned pads may include a plurality of under-ball metallurgy (UBM) patterns 154a for ball mount.

However, the disclosure is not limited thereto. In an alternative embodiment, the topmost one of the metallization layers 154 may include a plurality of UBM patterns 154a for ball mount and/or a plurality of connection pads 154b for mounting of other semiconductor components (see FIG. 7), and the numbers of the under-ball metallurgy patterns 154a and the number of the connection pads 154b are not limited according to the disclosure.

Figure 6:
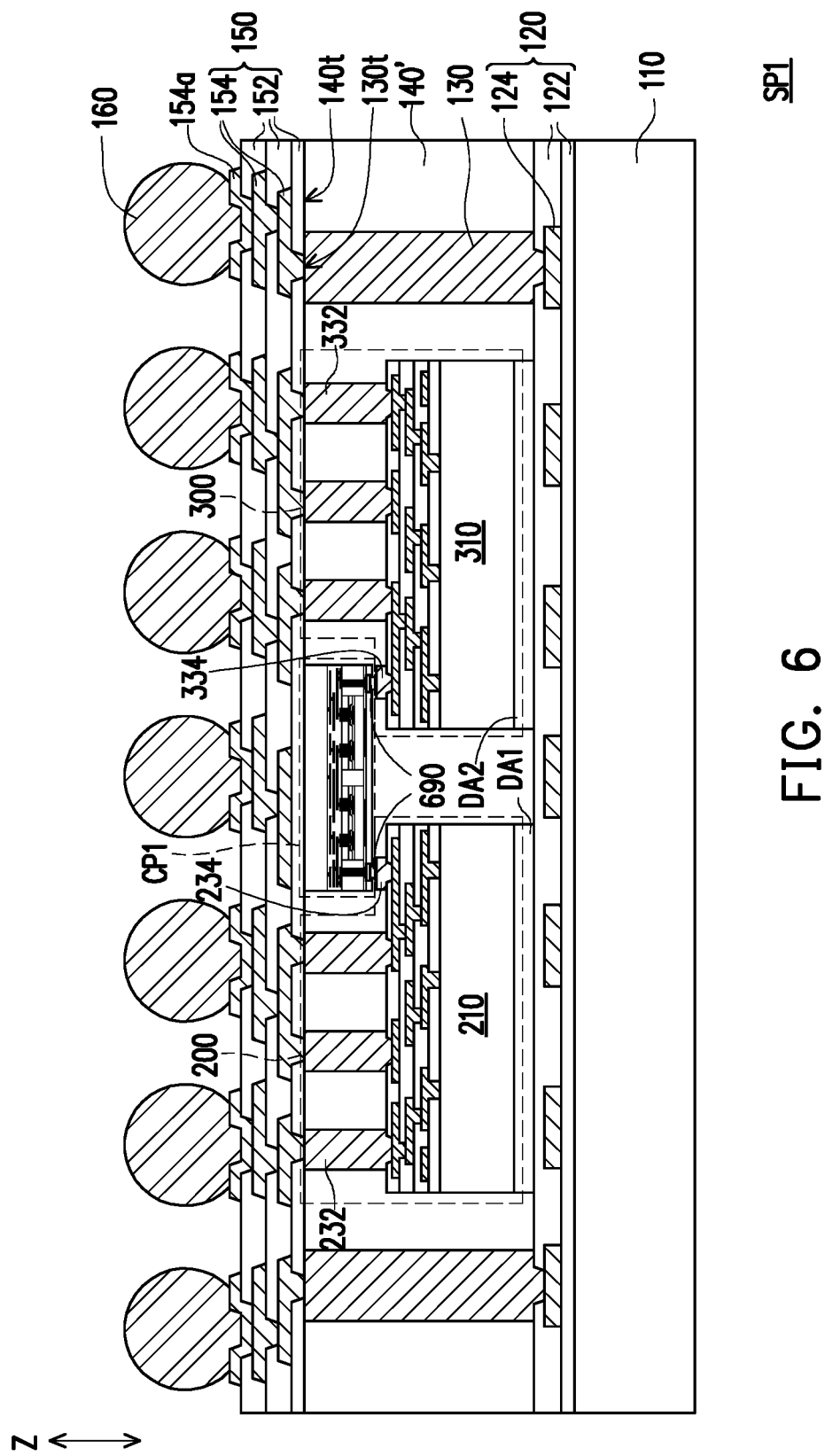

Referring to FIG. 6, in some embodiments, after the redistribution circuit structure 150 is formed, a plurality of conductive elements 160 are placed on the under-ball metallurgy patterns 154a. In some embodiments, the conductive elements 160 may be placed on the under-ball metallurgy patterns 154a through ball placement process and/or reflow process, or other suitable forming method. In some embodiments, the conductive elements 160 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The material of the conductive elements 160, for example, may include a conductive material such as solder, copper, aluminum, gold, nickel, silver, palladium, tin, or the like, or a combination thereof. In one embodiment, the material of the conductive elements 160, for example, may be solder-free.

In some embodiments, through the redistribution circuit structure 150, some of conductive elements 160 are electrically connected to the semiconductor die 200. In some embodiments, through the redistribution circuit structure 150, some of conductive elements 160 are electrically connected to the semiconductor die 300. In some embodiments, through the redistribution circuit structure 150, the semiconductor die 200 and/or the semiconductor die 300, some of the conductive elements 160 are electrically connected to the chip package CP1. In some embodiments, through the redistribution circuit structure 150, some of conductive elements 160 are electrically connected to the through vias 130. In some embodiments, through the redistribution circuit structure 150 and the through vias 130, some of the conductive elements 160 are electrically connected to the redistribution circuit structure 120. In certain embodiments, some of the conductive elements 160 may be electrically floated or grounded, the disclosure is not limited thereto.

Continued on FIG. 6, a dicing process is sequentially performed to cut the wafer having a plurality of the semiconductor package SP1 connected therebetween into individual and separated semiconductor package SP1. In one embodiment, the dicing process is a wafer dicing process including mechanical blade sawing or laser cutting. Up to here, the manufacture of the semiconductor package SP1 is completed. During the dicing process, a holding device (not shown) is adopted to secure the wafer of a plurality of the semiconductor package SP1 before cutting the wafer to prevent damages caused by the sequential process(es) or transportation. For example, the holding device may be an adhesive tape, a carrier film or a suction pad. In a further embodiment, after the dicing process, the carrier 110 may be debonded from the semiconductor package SP1, where the redistribution circuit structure 120 is exposed; the disclosure is not limited thereto.

Figure 7:
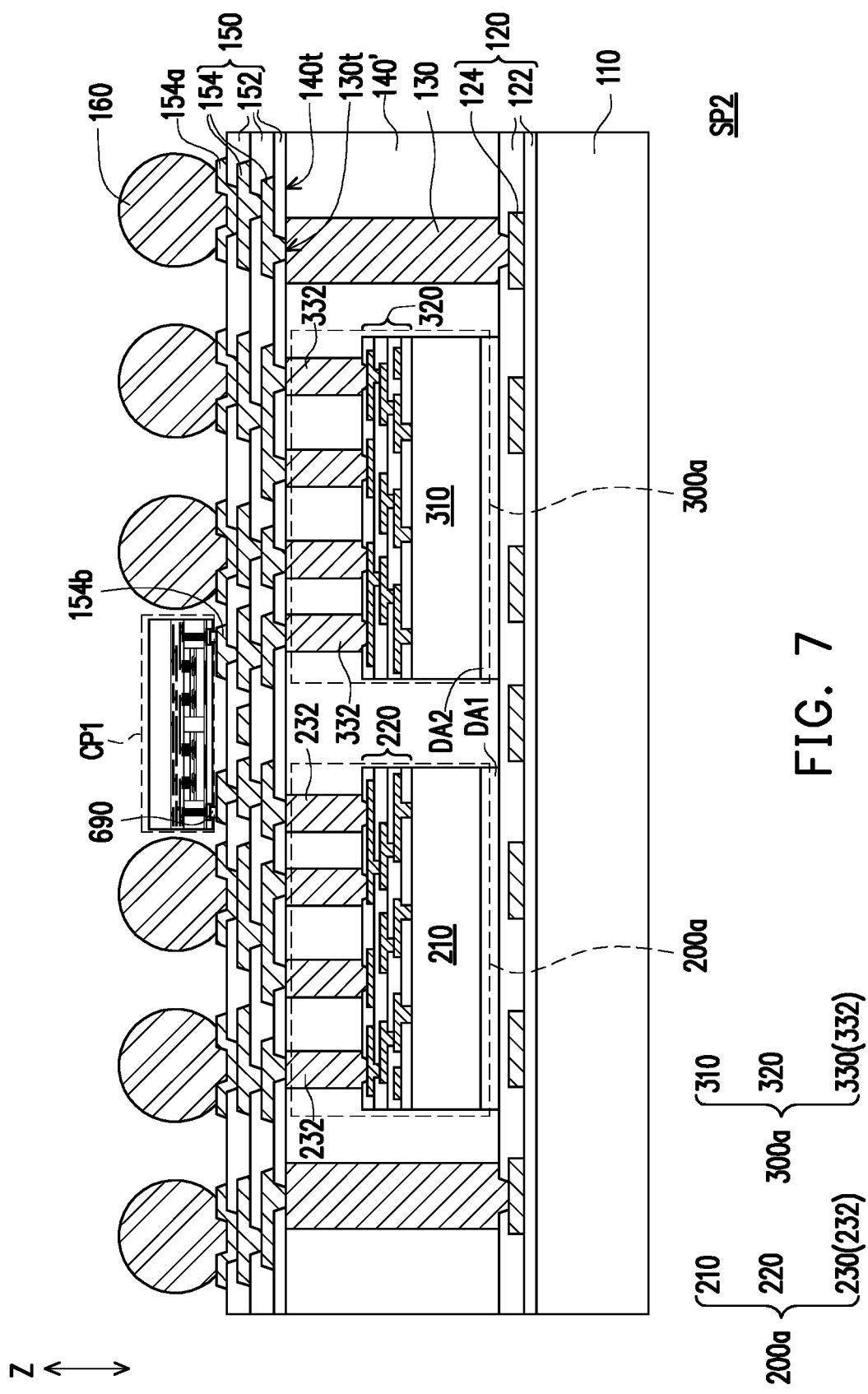
FIG. 7 is a schematic cross sectional view of a semiconductor package in accordance with some embodiments of the disclosure.

FIG. 7 is a schematic cross sectional view of a semiconductor package in accordance with some embodiments of the disclosure. Referring to FIG. 6 and FIG. 7 together, the semiconductor package SP1 depicted in FIG. 6 and the semiconductor package SP2 depicted in FIG. 7 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 6 and FIG. 7 together, the difference is that, for the semiconductor package SP2 depicted in FIG. 7, the chip package CP1 is disposed on the redistribution circuit structure 150 and located aside of the conductive elements 160, where the semiconductor die 200 and the semiconductor die 300 are replaced by a semiconductor die 200a and a semiconductor die 300a. For example, as shown in FIG. 7, the difference between the semiconductor die 200 and the semiconductor die 200a is that, the semiconductor die 200a includes the connecting vias 232 of the connecting vias 230, in which no connecting via 234 is included; and the difference between the semiconductor die 300 and the semiconductor die 300a is that, the semiconductor die 300a includes the connecting vias 332 of the connecting vias 330, in which no connecting via 334 is included. As shown in FIG. 7, the chip package CP1 is electrically connected to the semiconductor die 200a and the semiconductor die 300a through the redistribution circuit structure 150, where the chip package CP1 is electrically communicated to the semiconductor die 200a and the semiconductor die 300a.

In some embodiments, as shown in FIG. 7, the topmost one of the metallization layers 154 includes a plurality of UBM patterns 154a for ball mount and a plurality of connection pads 154b for mounting of other semiconductor components, and the numbers of the under-ball metallurgy patterns 154a and the numbers of the connection pads 154b are not limited according to the disclosure. In some embodiments, the chip package CP1 are bonded to the connection pads 154b, and the some of the conductive elements 160 are electrically connected to the chip package CP1 through the redistribution circuit structure 150 and the connection pads 154b.

As shown in FIG. 7, the chip package CP1 is overlapped with the semiconductor die 200a and the semiconductor die 300a in the stacking direction (e.g. the direction Z) of the redistribution circuit structure 120 and the semiconductor die 200a (or saying, the stacking direction of the redistribution circuit structure 120 and the semiconductor die 300a), and extends from the semiconductor die 200a to the semiconductor die 300a in a vertical projection on the redistribution circuit structure 120. In some embodiments, a height of the chip package CP1 is less than a height of the conductive elements 160 as measured in the direction Z. Due to the configuration, a short electrical path among the semiconductor die 200a, the semiconductor die 300a and the chip package CP1 (involving other semiconductor dies 400a, 400b) is achieved, thereby reducing signal loss thereof.

Figure 8:
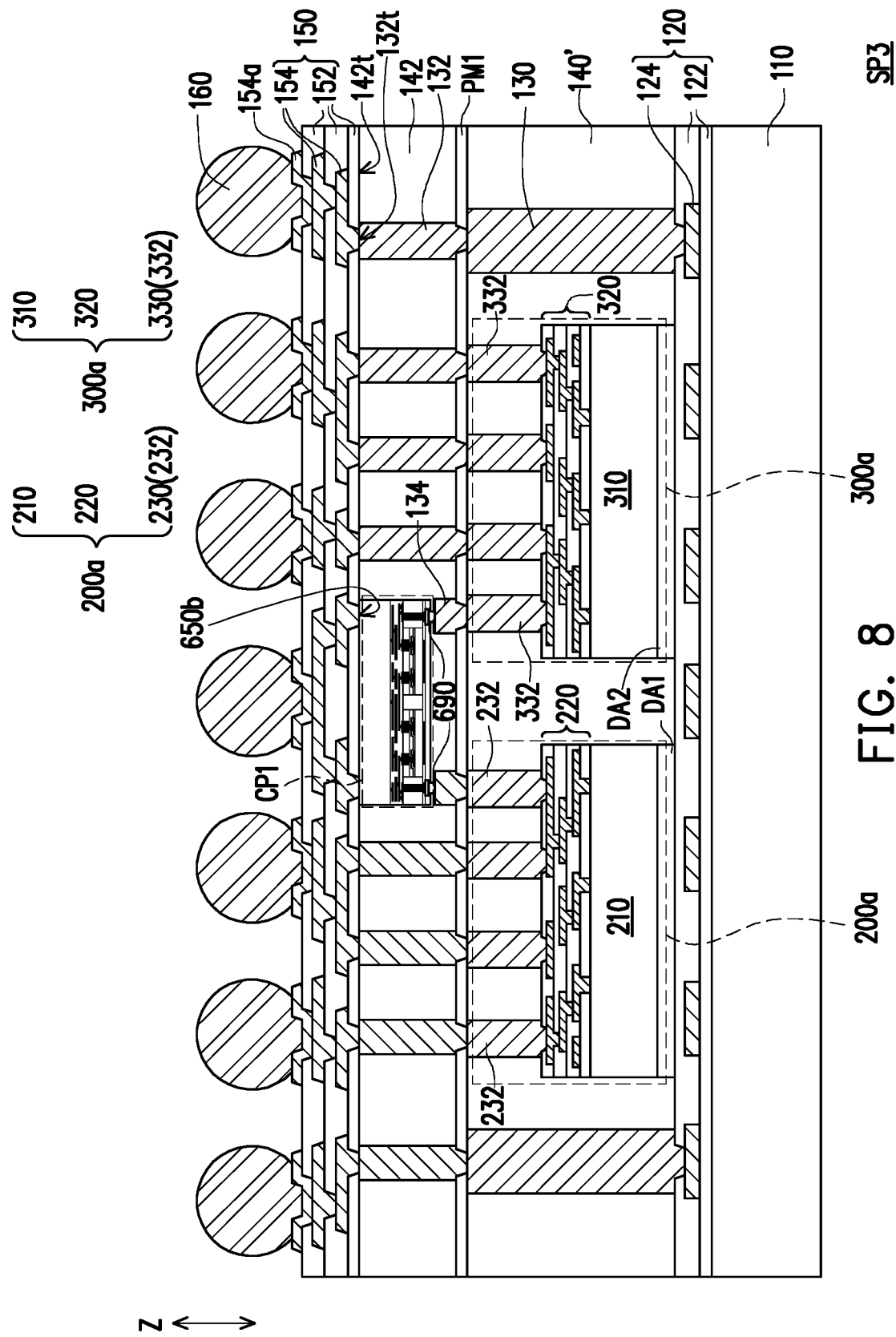
FIG. 8 is a schematic cross sectional view of a semiconductor package in accordance with some embodiments of the disclosure.

FIG. 8 is a schematic cross sectional view of a semiconductor package in accordance with some embodiments of the disclosure. Referring to FIG. 6 and FIG. 8 together, the semiconductor package SP1 depicted in FIG. 6 and the semiconductor package SP3 depicted in FIG. 8 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 6 and FIG. 8 together, the difference is that, for the semiconductor package SP3 depicted in FIG. 8, additional elements (e.g. a dielectric layer PM1, a plurality of conductive vias 132, a plurality of conductive vias 134 and an insulating encapsulant 142) are further included, where the chip package CP1 is disposed between the redistribution circuit structure 150 and the insulating encapsulant 140', and the semiconductor die 200 and the semiconductor die 300 are replaced by a semiconductor die 200a and a semiconductor die 300a respectively. For example, the difference between the semiconductor die 200 and the semiconductor die 200a is that, the semiconductor die 200a includes the connecting vias 232 of the connecting vias 230, in which no connecting via 234 is included; and the difference between the semiconductor die 300 and the semiconductor die 300a is that, the semiconductor die 300a includes the connecting vias 332 of the connecting vias 330, in which no connecting via 334 is included.

In some embodiments, as shown in FIG. 8, the dielectric layer PM1 is formed on and physically contacts the insulating encapsulant 140', where the dielectric layer PM1 has a plurality of openings exposing top surfaces of the connecting vias 232, the connecting vias 332 and the through vias 130. The material of the dielectric layer PM1 may include polyimide, PBO, BCB, a nitride such as silicon nitride, an oxide such as silicon oxide, PSG, BSG, BPSG, a combination thereof or the like, which may be patterned using a photolithography and/or etching process. In some embodiments, the conductive vias 132 and the conductive vias 134 are formed on the dielectric layer PM1 and connected to the connecting vias 232, 332 and the through vias 130 through the openings of the dielectric layer PM1. The materials and formations of the conductive vias 132 and the conductive vias 134 is the same or similar to the material and formation of the through vias 130 described in FIG. 1, thus may not be repeated herein.

In some embodiments, the chip package CP1 is disposed on the conductive vias 134 and surrounded by the conductive vias 132. In some embodiments, a height of the chip package CP1 is less than a height of the conductive vias 132 as measured in the direction Z. As shown in FIG. 8, the chip package CP1 is overlapped with the semiconductor die 200a and the semiconductor die 300a in the stacking direction (e.g. the direction Z) of the redistribution circuit structure 120 and the semiconductor die 200a (or saying, the stacking direction of the redistribution circuit structure 120 and the semiconductor die 300a), and extends from the semiconductor die 200a to the semiconductor die 300a in a vertical projection on the redistribution circuit structure 120. Due to the configuration, a short electrical path among the semiconductor die 200a, the semiconductor die 300a and the chip package CP1 (involving other semiconductor dies 400a, 400b) is achieved, thereby reducing signal loss thereof.

In some embodiments, the conductive vias 132, the conducive vias 134 and the chip package CP1 are encapsulated in the insulating encapsulant 142, and the dielectric layer PM1 exposed by the conductive vias 132 and the conducive vias 134 is covered by the insulating encapsulant 142. As shown in FIG. 8, a bottom surface of the chip package CP1 (e.g. the bottom surface 650b of the semiconductor substrate 650), top surfaces 132t of the conductive vias 132 and a top surface 142t of the insulating encapsulant 142 are substantially levelled. In other words, the surface of the chip package CP1 (e.g. the bottom surface 650b of the semiconductor substrate 650) and the top surfaces 132t of the conductive vias 132 are substantially coplanar to the top surface 142t of the insulating encapsulant 142. In some embodiments, the redistribution circuit structure 150 is located on the chip package CP1, the conductive vias 132 and the insulating encapsulant 142, and is physically and electrically connected to the conductive vias 132. The material and formation of the insulating encapsulant 142 is the same or similar to the materials and formations of the insulating encapsulant 140 and the insulating encapsulant 140' described in FIG. 3 and FIG. 4, thus may not be repeated herein.

As shown in FIG. 8, the chip package CP1 is electrically connected to the semiconductor die 200a and the semiconductor die 300a through the connecting vias 690, the conductive vias 134 and the connecting vias 232 and through the connecting vias 690, the conductive vias 134 and the connecting vias 332, respectively. In other words, the chip package CP1 is electrically communicated to the semiconductor die 200a and the semiconductor die 300a, where the semiconductor die 200a and the semiconductor die 300a are electrically communicated to each other through the chip package CP1. In some embodiments, some of the conductive elements 160 are electrically connected to the semiconductor dies 200a through the redistribution circuit structure 150 and some of the conductive vias 132. In some embodiments, some of the conductive elements 160 are electrically connected to the semiconductor dies 300a through the redistribution circuit structure 150 and some of the conductive vias 132. In some embodiments, some of the conductive elements 160 are electrically connected to the chip package CP1 through the redistribution circuit structure 150, some of the conductive vias 132, the semiconductor dies 200a and/or 300a, and the conductive vias 134. In some embodiments, some of the conductive elements 160 are electrically connected to the through vias 130 through the redistribution circuit structure 150 and some of the conductive vias 132. In some embodiments, some of the conductive elements 160 are electrically connected to the redistribution circuit structure 120 through the redistribution circuit structure 150, some of the conductive vias 132 and the through vias 130.

Figure 9:
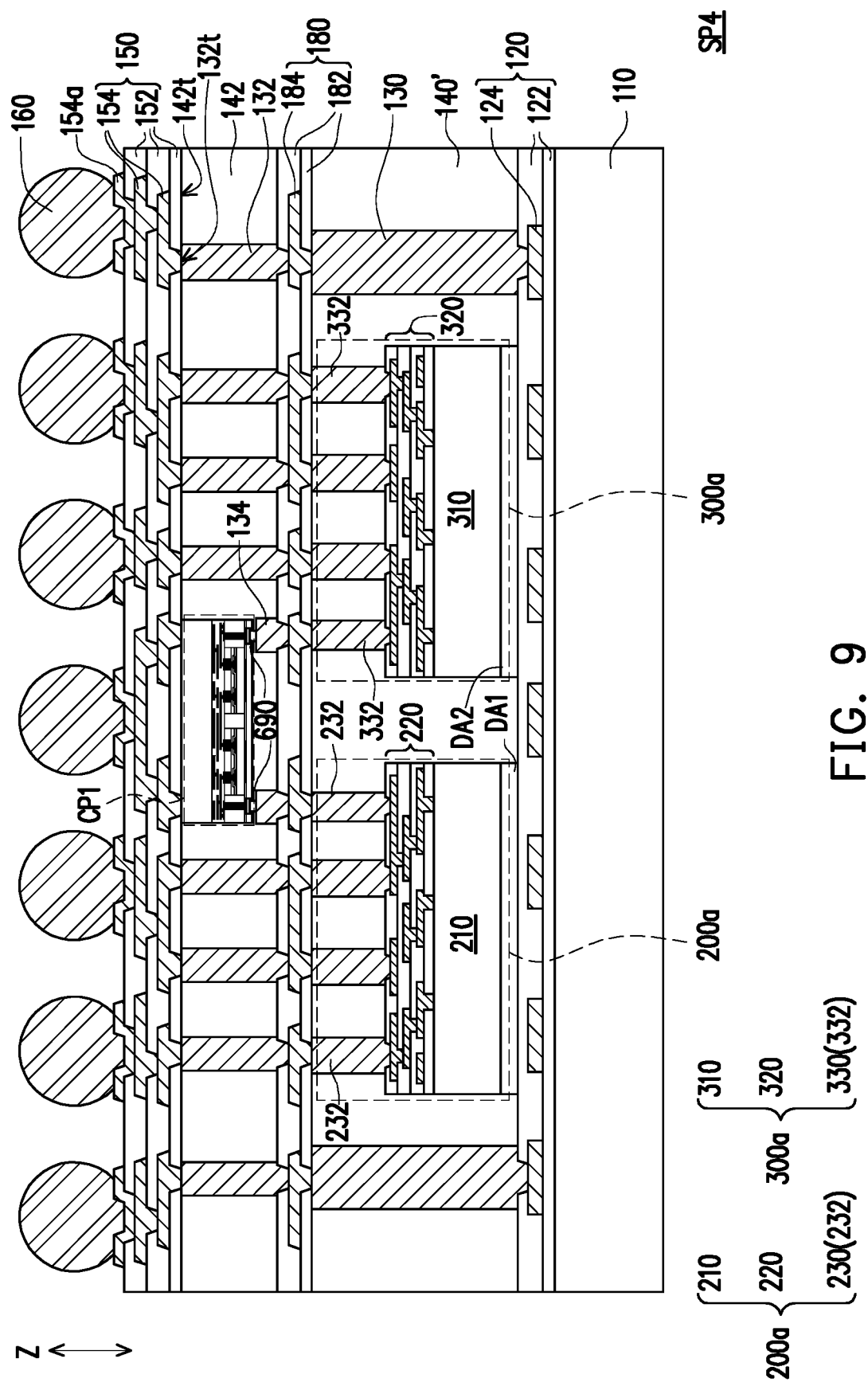
FIG. 9 is a schematic cross sectional view of a semiconductor package in accordance with some embodiments of the disclosure.

FIG. 9 is a schematic cross sectional view of a semiconductor package in accordance with some embodiments of the disclosure. Referring to FIG. 8 and FIG. 9 together, the semiconductor package SP3 depicted in FIG. 8 and the semiconductor package SP4 depicted in FIG. 9 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 8 and FIG. 9 together, the difference is that, for the semiconductor package SP4 depicted in FIG. 9, the dielectric layer PM1 is replaced with a redistribution circuit structure 180. For example, the formation of the redistribution circuit structure 180 includes sequentially forming one or more polymer dielectric layers 182 and one or more metallization layers 184 in alternation. In certain embodiments, the redistribution circuit structure 180 includes two polymer dielectric layers 182 and one metallization layer 184 sandwiched therebetween as shown in FIG. 9; however, the disclosure is not limited thereto. Due to the configuration of the polymer dielectric layers 182 and the metallization layer 184, a routing function is provided to the semiconductor package SP4.

The numbers of the metallization layers and the polymer dielectric layers included in the redistribution circuit structure 180 are not limited thereto. For example, the numbers of the metallization layers and the polymer dielectric layers may be one or more than one. The material and formation of the redistribution circuit structure 180 is the same or similar to the material and formation of the redistribution circuit structure 120 described in FIG. 1 or the material and formation of the redistribution circuit structure 150 described in FIG. 5, thus may not be repeated herein.

As shown in FIG. 9, the chip package CP1 is electrically connected to the semiconductor die 200a through the conductive vias 134, the redistribution circuit structure 180 (e.g. the metallization layer 184) and the connecting vias 232, and the chip package CP1 is electrically connected to the semiconductor die 300a through the conductive vias 134, the redistribution circuit structure 180 (e.g. the metallization layer 184) and the connecting vias 332. In other words, the chip package CP1 is electrically communicated to the semiconductor die 200a and the semiconductor die 300a, where the semiconductor die 200a and the semiconductor die 300a are electrically communicated to each other through the chip package CP1. In some embodiments, the conductive elements 160 are electrically connected to the redistribution circuit structure 180 through the redistribution circuit structure 150 and the conductive vias 132. In some embodiments, some of the conductive elements 160 are electrically connected to the semiconductor dies 200a through the redistribution circuit structure 150, some of the conductive vias 132 and the redistribution circuit structure 180. In some embodiments, some of the conductive elements 160 are electrically connected to the semiconductor dies 300a through the redistribution circuit structure 150, some of the conductive vias 132 and the redistribution circuit structure 180. In some embodiments, some of the conductive elements 160 are electrically connected to the chip package CP1 through the redistribution circuit structure 150, some of the conductive vias 132, the redistribution circuit structure 180, the conductive vias 134, and/or the semiconductor dies 200a, 300a. In some embodiments, some of the conductive elements 160 are electrically connected to the through vias 130 through the redistribution circuit structure 150, some of the conductive vias 132 and the redistribution circuit structure 180. In some embodiments, some of the conductive elements 160 are electrically connected to the redistribution circuit structure 120 through the redistribution circuit structure 150, some of the conductive vias 132, the redistribution circuit structure 180 and the through vias 130. Due to the configuration, a short electrical path among the semiconductor die 200a, the semiconductor die 300a and the chip package CP1 (involving other semiconductor dies 400a, 400b) is achieved, thereby reducing signal loss thereof.

Figure 10:
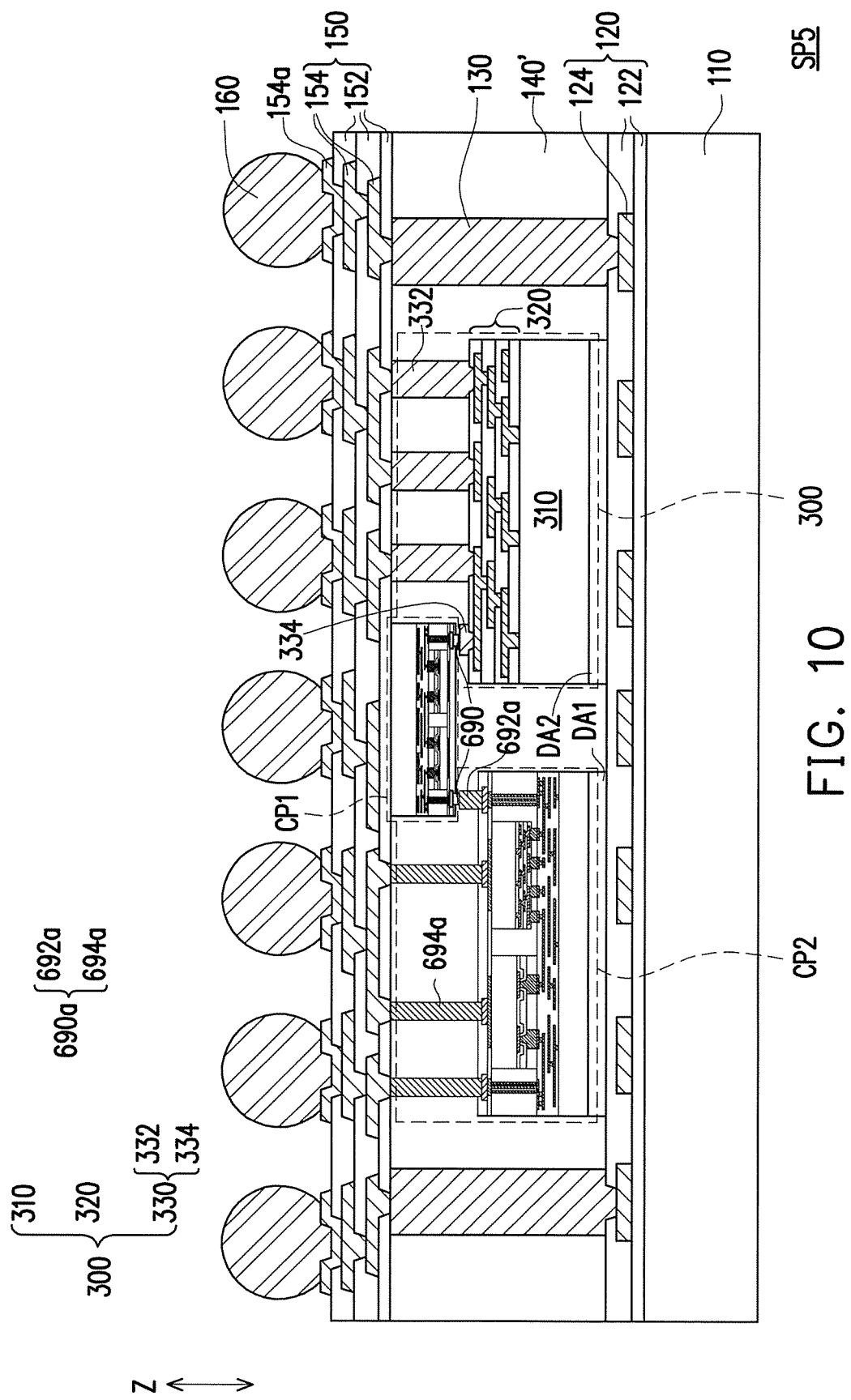
FIG. 10 is a schematic cross sectional view of a semiconductor package in accordance with some embodiments of the disclosure.

FIG. 10 is a schematic cross sectional view of a semiconductor package in accordance with some embodiments of the disclosure. Referring to FIG. 6 and FIG. 10 together, the semiconductor package SP1 depicted in FIG. 6 and the semiconductor package SP5 depicted in FIG. 10 are similar; such that the elements similar to or substantially the same as the elements described above will use the same reference numbers, and certain details or descriptions of the same elements and the relationship thereof (e.g. the relative positioning configuration and electrical connection) will not be repeated herein.

Figure 15:
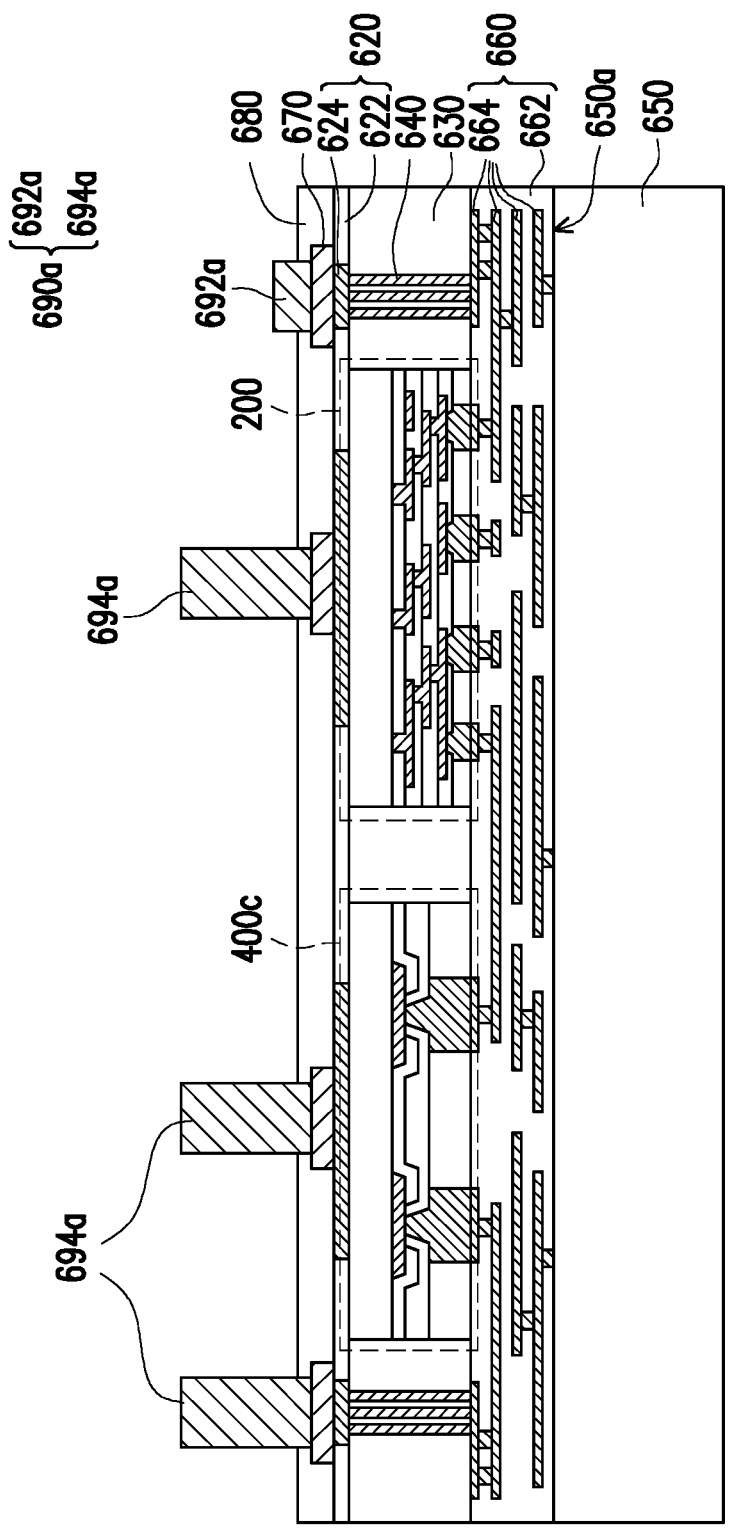
FIG. 15 is a schematic cross sectional view of a chip package included in a semiconductor package in accordance with some embodiments of the disclosure.

Referring to FIG. 6 and FIG. 10 together, the difference is that, for the semiconductor package SP5 depicted in FIG. 10, a chip package CP2 is included and disposed in the positioning location of the semiconductor die 200 depicted in FIG. 6. In one embodiment, the semiconductor die 200 is integrated into the chip package CP2. For example, as shown in FIG. 15, the chip package CP2 has a structure similar to the structure of the chip package CP1 depicted in FIG. 14, where in the chip package CP2, the semiconductor dies 400a and 400b of the chip package CP1 depicted in FIG. 14 are replaced by the semiconductor die 200 depicted in FIG. 1 to FIG. 6 and a semiconductor die 400c, respectively. In certain embodiments, the chip package CP2 may have a structure similar to the structure of the chip package CP1 depicted in FIG. 14, where in the chip package CP2, the semiconductor dies 400a and 400b of the chip package CP1 depicted in FIG. 14 may be replaced by the semiconductor die 200a depicted in FIG. 7 to FIG. 9 and a semiconductor die 400c, respectively. However, the disclosure is not limited thereto; in an alternative embodiment, the chip package CP2 may include a structure the same as the structure of the chip package CP1 depicted in FIG. 14, where the semiconductor dies 400a, 400b may be replaced by other types of semiconductor dies, or remained in the chip package CP2.

In one embodiment, the semiconductor die 400c may be as same as the semiconductor dies 400a and/or 400b. In an alternative embodiment, the semiconductor die 400c may be the different from the semiconductor dies 400a and 400b. The disclosure is not limited thereto.

In some embodiments, an enlarged view of the structure of the chip package CP2 depicted in FIG. 10 is shown in FIG. 15 for illustrated propose, and does not limit the disclosure. As shown in FIG. 15, in the chip package CP2, the interconnection structure 660 is disposed on the semiconductor substrate 650, the semiconductor die 200 and the semiconductor die 400c are disposed on and electrically connected to the interconnection structure 660 and encapsulated in the insulating encapsulant 630, the redistribution circuit structure 620 is disposed on the insulating encapsulant 630, the contact pads 670 are disposed on and distributed over the redistribution circuit structure 620, the protection layer 680 covers the contact pads 670 and has openings exposing portions of the contact pads 670, and connecting vias 690a are disposed on and connected to the contact pads 670 through the openings of the protection layer 680, where the through vias 640 penetrate the insulating encapsulant 630 so as to physically and electrically connect to the interconnection structure 660 and the redistribution circuit structure 620. In some embodiments, in FIG. 10, the connecting vias 690a includes at least one connecting via 692a and connecting vias 694a, where a height of the connecting via 692a is less than a height of the connecting vias 694a as measured in direction Z. The material and formation of the connecting vias 690a is similar to the material and formation of the connecting vias 690 described in FIG. 14.

In certain embodiments, the chip package CP1 is electrically connected to the chip package CP2 through the connecting vias 690 of the chip package CP1 and the connecting via 692a of the chip package CP2, and the chip package CP1 is electrically connected to the semiconductor die 300 through the connecting vias 690 of the chip package CP1 and the connecting vias 334 of the semiconductor die 300. In other words, the chip package CP1 is electrically communicated to the chip package CP2 (e.g. the semiconductor die 200 and the semiconductor dies 400c) and the semiconductor die 300, where the chip package CP2 (e.g. the semiconductor die 200 and the semiconductor dies 400c) and the semiconductor die 300 are electrically communicated to each other through the chip package CP1. In some embodiments, some of the conductive elements 160 are electrically connected to the chip package CP2 (e.g. the semiconductor die 200 and the semiconductor dies 400c) through the redistribution circuit structure 150. In some embodiments, some of the conductive elements 160 are electrically connected to the semiconductor dies 300 through the redistribution circuit structure 150. In some embodiments, some of the conductive elements 160 are electrically connected to the chip package CP1 through the redistribution circuit structure 150 and the chip package CP2 (e.g. the semiconductor die 200 and the semiconductor dies 400c) or through the redistribution circuit structure 150 and the semiconductor die 300. In some embodiments, some of the conductive elements 160 are electrically connected to the through vias 130 through the redistribution circuit structure 150. In some embodiments, some of the conductive elements 160 are electrically connected to the redistribution circuit structure 120 through the redistribution circuit structure 150 and the through vias 130.

As shown in FIG. 10, the chip package CP1 is overlapped with the chip package CP2 (e.g. the semiconductor die 200) and the semiconductor die 300 in the stacking direction (e.g. the direction Z) of the redistribution circuit structure 120 and the chip package CP2 having the semiconductor die 200 (or saying, the stacking direction of the redistribution circuit structure 120 and the semiconductor die 300), and extends from the chip package CP2 (e.g. the semiconductor die 200) to the semiconductor die 300 in a vertical projection on the redistribution circuit structure 120. Due to the configuration, a short electrical path among the chip package CP2 (e.g. the semiconductor die 200 and the semiconductor dies 400c), the semiconductor die 300 and the chip package CP1 (involving other semiconductor dies 400a, 400b) is achieved, thereby reducing signal loss thereof.

In accordance with some embodiments, a semiconductor package includes a first chip package including a plurality of first semiconductor dies and a first insulating encapsulant, a second semiconductor die, a third semiconductor die, and a second insulating encapsulant. The plurality of first semiconductor dies are electrically connected to each other, and the first insulating encapsulant encapsulates the plurality of first semiconductor dies. The second semiconductor die and the third semiconductor die are electrically communicated to each other by connecting to the first chip package, wherein the first chip package is stacked on the second semiconductor die and the third semiconductor die. The second insulating encapsulant encapsulates the first chip package, the second semiconductor die, and the third semiconductor die.

In accordance with some embodiments, a semiconductor package includes a first semiconductor die, a second semiconductor die, a first insulating encapsulant, a first redistribution circuit structure, and a chip package. The first semiconductor die and the second semiconductor die are encapsulated in the first insulating encapsulant. The first redistribution circuit structure is located on the first insulating encapsulant and electrically connected to the first semiconductor die and the second semiconductor die. The chip package is electrically connected to the first semiconductor die and the second semiconductor die, wherein the chip package includes a plurality of third semiconductor dies electrically connected to each other and a second insulating encapsulant encapsulating the plurality of third semiconductor dies. The chip package is overlapped with the first semiconductor die and the second semiconductor die in a stacking direction of the first redistribution circuit structure and the first insulating encapsulant.

In accordance with some embodiments, a manufacturing method of a semiconductor package is provided with the following steps, providing a carrier; disposing a first semiconductor die and a second semiconductor die on the carrier; disposing a chip package comprising a plurality of third semiconductor dies electrically connected thereto and an insulating material encapsulating the plurality of third semiconductor dies over the first semiconductor die and the second semiconductor die, wherein the chip package extends from the first semiconductor die to the second semiconductor die and is electrically connected to the first semiconductor die and the second semiconductor die; encapsulating the first semiconductor die and the second semiconductor die in an insulating encapsulant; forming a first redistribution circuit structure on the insulating encapsulant; and forming conductive elements on the first redistribution circuit structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a first chip package, comprising:
a plurality of first semiconductor dies, electrically connected to each other; and
a first insulating encapsulant, encapsulating the plurality of first semiconductor dies;
a second semiconductor die and a third semiconductor die, electrically communicated to each other by connecting to the first chip package, wherein the first chip package is stacked on the second semiconductor die and the third semiconductor die;
a second insulating encapsulant, encapsulating the first chip package, the second semiconductor die, and the third semiconductor die; and
through vias, penetrating the second insulating encapsulant and arranged aside of the second semiconductor die and the third semiconductor die, wherein the through vias are overlapped with the second semiconductor die and the third semiconductor die along a direction perpendicular to a stacking direction of the first chip package and the second semiconductor die.

2. The semiconductor package of claim 1, wherein the second semiconductor die and the third semiconductor die are arranged side by side, and the first chip package extends from the second semiconductor die to the third semiconductor die.

3. The semiconductor package of claim 1, further comprising:
a first redistribution circuit structure and a second redistribution circuit structure, located at two opposite sides of the second insulating encapsulant and electrically connected to the second semiconductor die and the third semiconductor die; and
conductive elements, located on and electrically connected to the second redistribution circuit structure, wherein the second redistribution circuit structure is located between the second insulating encapsulant and the conductive elements.

4. The semiconductor package of claim 3, wherein the through vias are connected to the first redistribution circuit structure and the second redistribution circuit structure and electrically coupled to the second semiconductor die and the third semiconductor die.

5. The semiconductor package of claim 4, wherein the first chip package is electrically connected to the first redistribution circuit structure through the second semiconductor die, the second redistribution circuit structure and the through vias or through the third semiconductor die, the second redistribution circuit structure and the through vias.

6. The semiconductor package of claim 1, further comprising:
a second chip package, comprising:
the second semiconductor die and a fourth semiconductor die electrically connected to each other; and
a third insulating encapsulant, encapsulating the second semiconductor die and the fourth semiconductor die.

7. The semiconductor package of claim 6, wherein the second insulating encapsulant encapsulates the first chip package, the second chip package, and the third semiconductor die.

8. The semiconductor package of claim 6, wherein the first chip package is stacked on the second chip package and the third semiconductor die and extends from the second chip package to the third semiconductor die.

9. The semiconductor package of claim 1, further comprising a third redistribution circuit structure located on and electrically connected to the second semiconductor die and the third semiconductor die, wherein the second semiconductor die and the third semiconductor die are located between the first chip package and the third redistribution circuit structure along the stacking direction.

10. A semiconductor package, comprising:
a first semiconductor die and a second semiconductor die, encapsulated in a first insulating encapsulant;
a first redistribution circuit structure, located on the first insulating encapsulant and electrically connected to the first semiconductor die and the second semiconductor die;
a chip package, electrically connected to the first semiconductor die and the second semiconductor die, wherein the chip package comprises:
a plurality of third semiconductor dies, electrically connected to each other; and
a second insulating encapsulant, encapsulating the plurality of third semiconductor dies,
wherein a positioning location of the chip package is overlapped with a positioning location of the first semiconductor die and a positioning location of the second semiconductor die in a stacking direction of the first redistribution circuit structure and the first insulating encapsulant, and wherein the chip package is located between the first redistribution circuit structure and the first insulating encapsulant; and
through vias, penetrating the first insulating encapsulant and arranged aside of the first semiconductor die and the second semiconductor die, wherein the through vias are overlapped with the first semiconductor die and the second semiconductor die along a direction perpendicular to the stacking direction.

11. The semiconductor package of claim 10, wherein the first semiconductor die and the second semiconductor die are arranged side-by-side, and the chip package extends from the first semiconductor die to the second semiconductor die.

12. The semiconductor package of claim 10, further comprising:
 conductive vias, located aside of a positioning location of the chip package; and
 a third insulating encapsulant, encapsulating the chip package and the conductive vias, wherein the third insulating encapsulant is located between the first insulating encapsulant and the first redistribution circuit structure.

13. The semiconductor package of claim 12, wherein the second insulating encapsulant is wrapped by the third insulating encapsulant.

14. The semiconductor package of claim 12, further comprising:
 a second redistribution circuit structure, located between the first insulating encapsulant and the third insulating encapsulant and electrically connected to the first semiconductor die and the second semiconductor die,
 wherein the chip package is sandwiched between the first redistribution circuit structure and the second redistribution circuit structure.

15. The semiconductor package of claim 10, further comprising a third redistribution circuit structure located on and electrically connected to the first semiconductor die and the second semiconductor die, wherein the first semiconductor die and the second semiconductor die are located between the chip package and the third redistribution circuit structure along the stacking direction.

16. The semiconductor package of claim 10, further comprising:
 conductive elements, located on and electrically connected to the first redistribution circuit structure, wherein the first redistribution circuit structure is located between the conductive elements and the first insulating encapsulant.

17. A manufacturing method of a semiconductor package, comprising:
 providing a carrier;
 disposing a first semiconductor die and a second semiconductor die on the carrier;
 electrically connecting the first semiconductor die to the second semiconductor die through disposing a chip package comprising a plurality of third semiconductor dies electrically connected thereto and an insulating material encapsulating the plurality of third semiconductor dies over the first semiconductor die and the second semiconductor die, wherein the chip package extends from the first semiconductor die to the second semiconductor die;
 forming through vias arranged aside of the first semiconductor die and the second semiconductor die, the through vias being overlapped with the first semiconductor die and the second semiconductor die along a direction perpendicular to a stacking direction of the chip package and the first semiconductor die;
 encapsulating the through vias, the first semiconductor die and the second semiconductor die in an insulating encapsulant, the through vias penetrating the insulating encapsulant;
 forming a redistribution circuit structure on the insulating encapsulant; and
 forming conductive elements on the redistribution circuit structure.

18. The manufacturing method of claim 17, wherein disposing the chip package over the first semiconductor die and the second semiconductor die is prior to encapsulating the through vias, the first semiconductor die and the second semiconductor die in the insulating encapsulant, wherein encapsulating the through vias, the first semiconductor die and the second semiconductor die in the insulating encapsulant further comprises encapsulating the chip package in the insulating encapsulant.

19. The manufacturing method of claim 17, wherein disposing the chip package over the first semiconductor die and the second semiconductor die is prior to the forming the redistribution circuit structure and after encapsulating the first semiconductor die and the second semiconductor die in the insulating encapsulant, so as to dispose the chip package between the redistribution circuit structure and the insulating encapsulant.

20. The manufacturing method of claim 17, wherein forming the redistribution circuit structure is prior to disposing the chip package on the first semiconductor die and the second semiconductor die, so as to dispose the chip package on the redistribution circuit structure, wherein the chip package is electrically connected to the redistribution circuit structure.

* * * * *